(12) United States Patent
Arizono et al.

(10) Patent No.: US 11,915,778 B2
(45) Date of Patent: Feb. 27, 2024

(54) SEMICONDUCTOR MEMORY DEVICE OUTPUTTING DATA FROM MEMORY CELL GROUPS IN PARALLEL AND SYSTEM

(71) Applicant: Kioxia Corporation, Tokyo (JP)

(72) Inventors: Daisuke Arizono, Yokohama (JP); Akio Sugahara, Yokohama (JP); Mitsuhiro Abe, Kawasaki (JP); Mitsuaki Honma, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 44 days.

(21) Appl. No.: 17/654,890

(22) Filed: Mar. 15, 2022

(65) Prior Publication Data

US 2023/0109388 A1 Apr. 6, 2023

(30) Foreign Application Priority Data

Oct. 4, 2021 (JP) ................. 2021-163427

(51) Int. Cl.
*G11C 16/06* (2006.01)
*G11C 7/06* (2006.01)
*G11C 7/10* (2006.01)

(52) U.S. Cl.
CPC ............. *G11C 7/065* (2013.01); *G11C 7/106* (2013.01); *G11C 7/1039* (2013.01); *G11C 7/1087* (2013.01)

(58) Field of Classification Search
CPC ..................................... G11C 7/065
USPC ................................... 365/185.21
See application file for complete search history.

(56) References Cited

U.S. PATENT DOCUMENTS

| 8,055,085 | B2 | 11/2011 | Monro |
| 8,791,843 | B2 | 7/2014 | Cohen |
| 10,847,230 | B2 | 11/2020 | Ando et al. |
| 2009/0228761 | A1* | 9/2009 | Perlmutter ............ G06F 3/0604 714/763 |
| 2015/0002320 | A1 | 1/2015 | Kataoka et al. |
| 2018/0024779 | A1* | 1/2018 | Kojima ............... G06F 12/0246 711/103 |

FOREIGN PATENT DOCUMENTS

| JP | 5812188 B2 | 11/2015 |
| JP | 2020-47312 A | 3/2020 |

\* cited by examiner

*Primary Examiner* — Hoai V Ho
(74) *Attorney, Agent, or Firm* — Oblon, McClelland, Maier & Neustadt, L.L.P.

(57) ABSTRACT

A semiconductor memory device includes: a core unit including first and second memory cell groups; and a control circuit. The control circuit is configured to, in response to a read command including designation of a first address and designation of a second address, read first data from the first memory cell group, read second data from the second memory cell group, and output third data and fourth data in parallel. The first and second addresses correspond to the first and second memory cell groups, respectively. The designation of the second address is made after the designation of the first address. The third data corresponds to the read first data. The fourth data corresponds to the read second data.

16 Claims, 27 Drawing Sheets

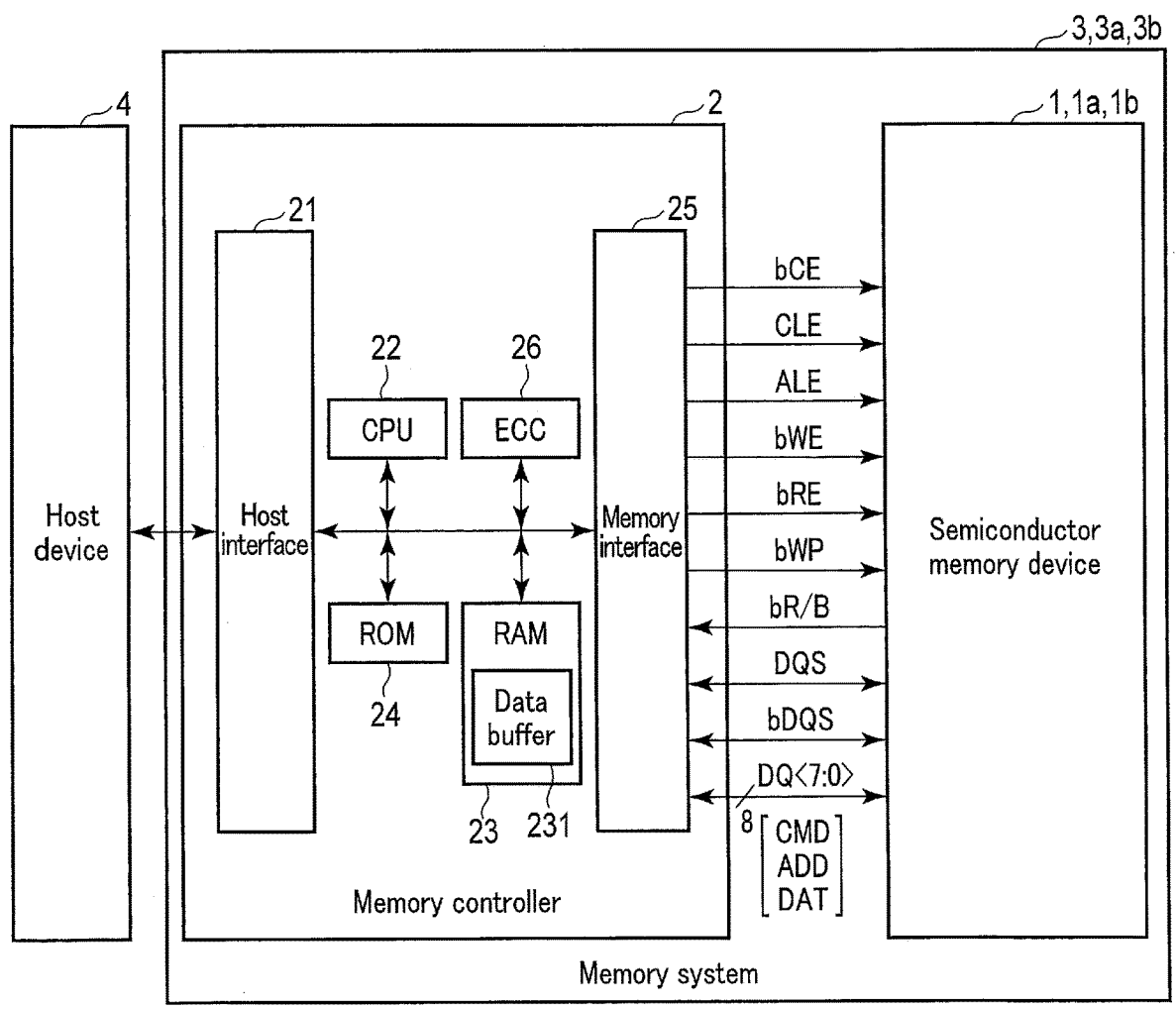
F I G. 1

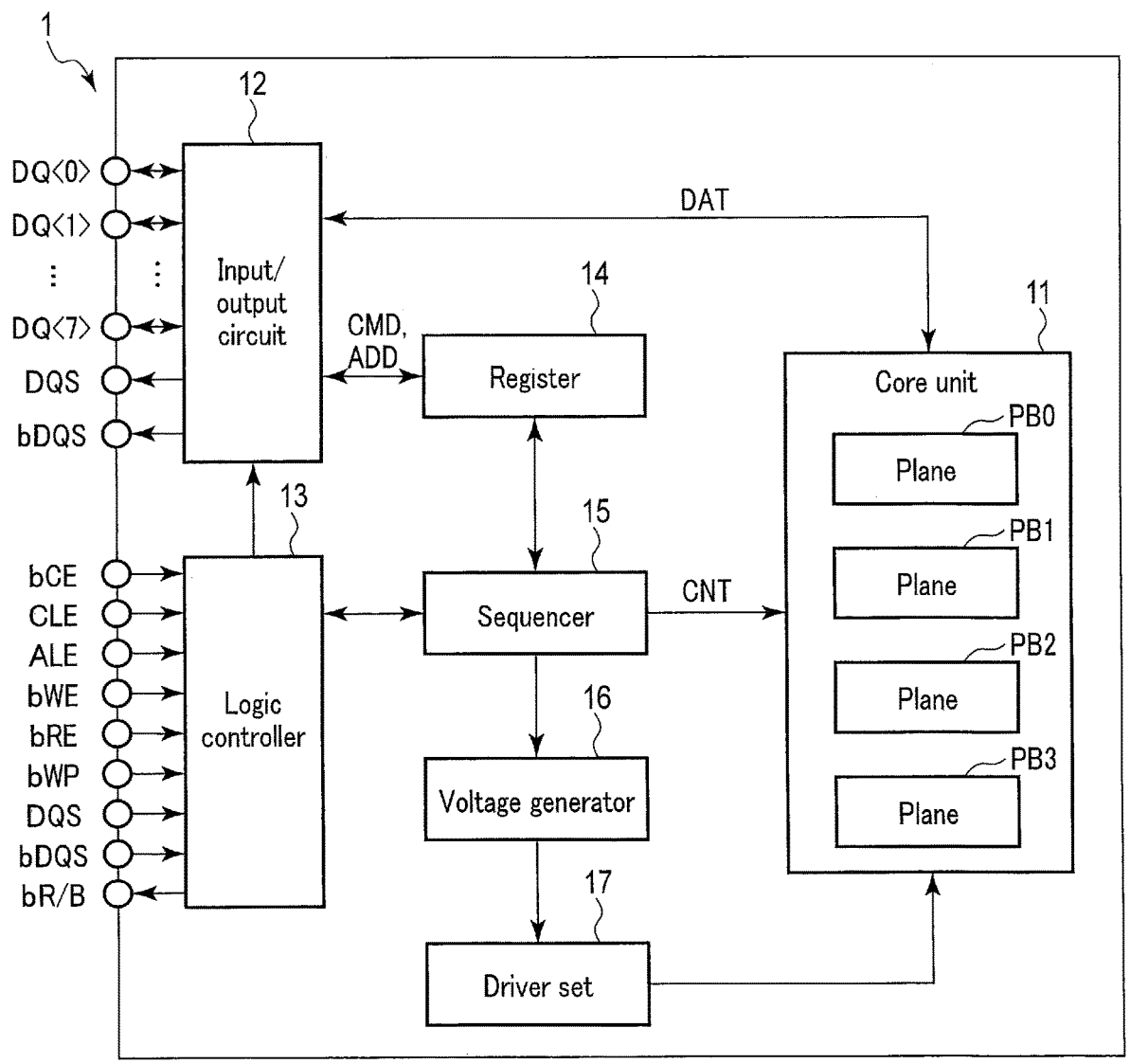
F I G. 2

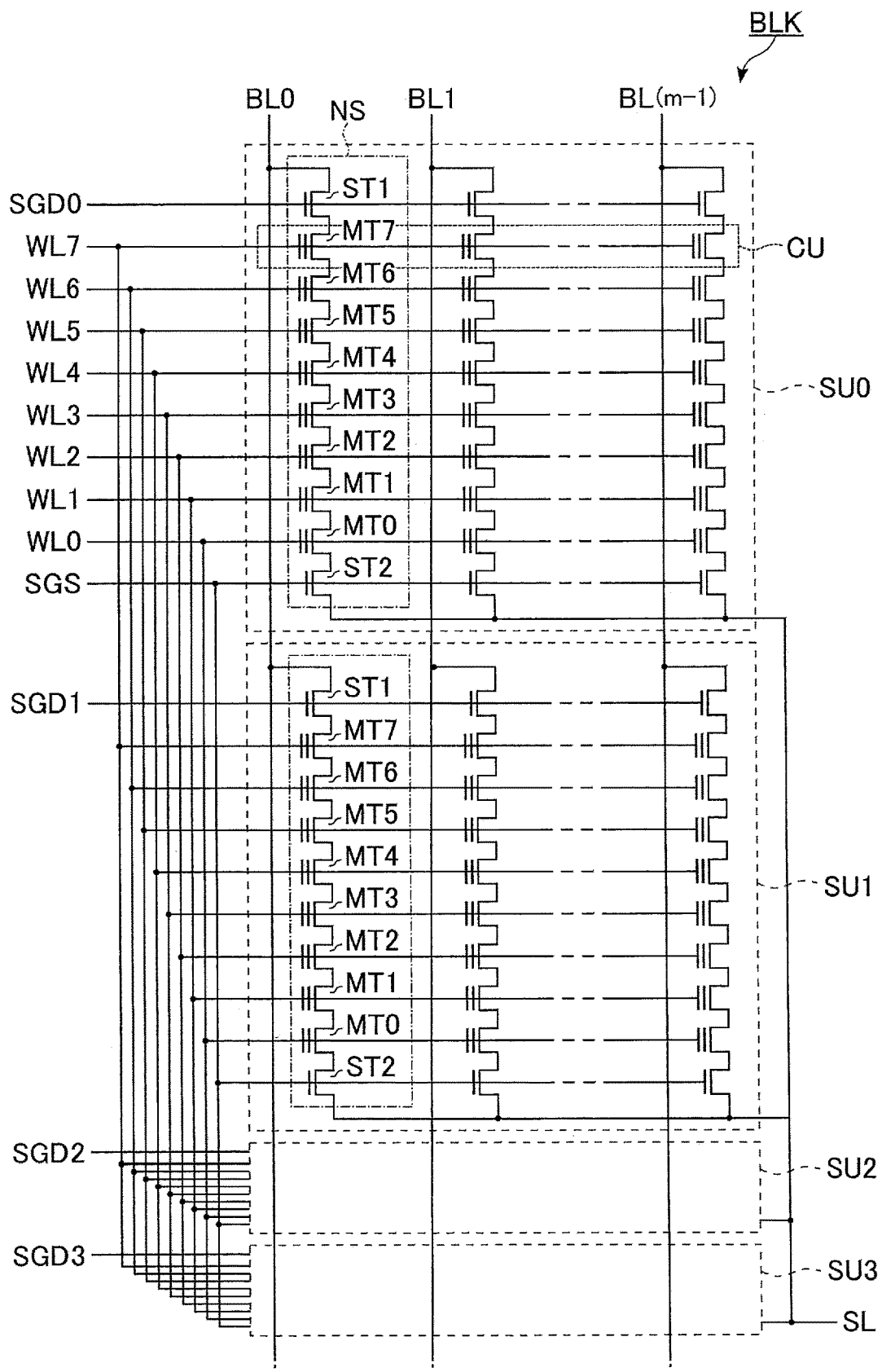
F I G. 4

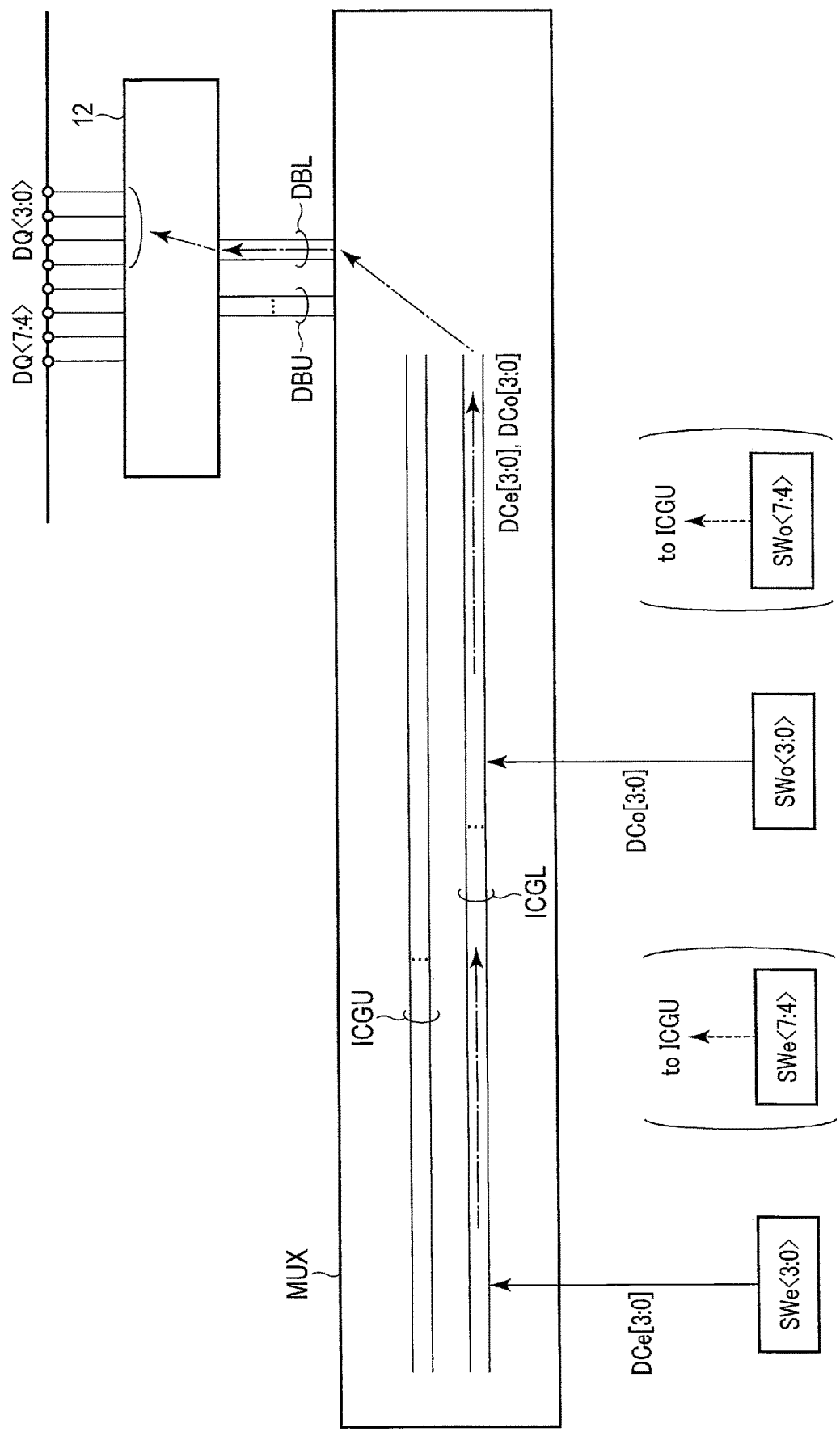
F I G. 10

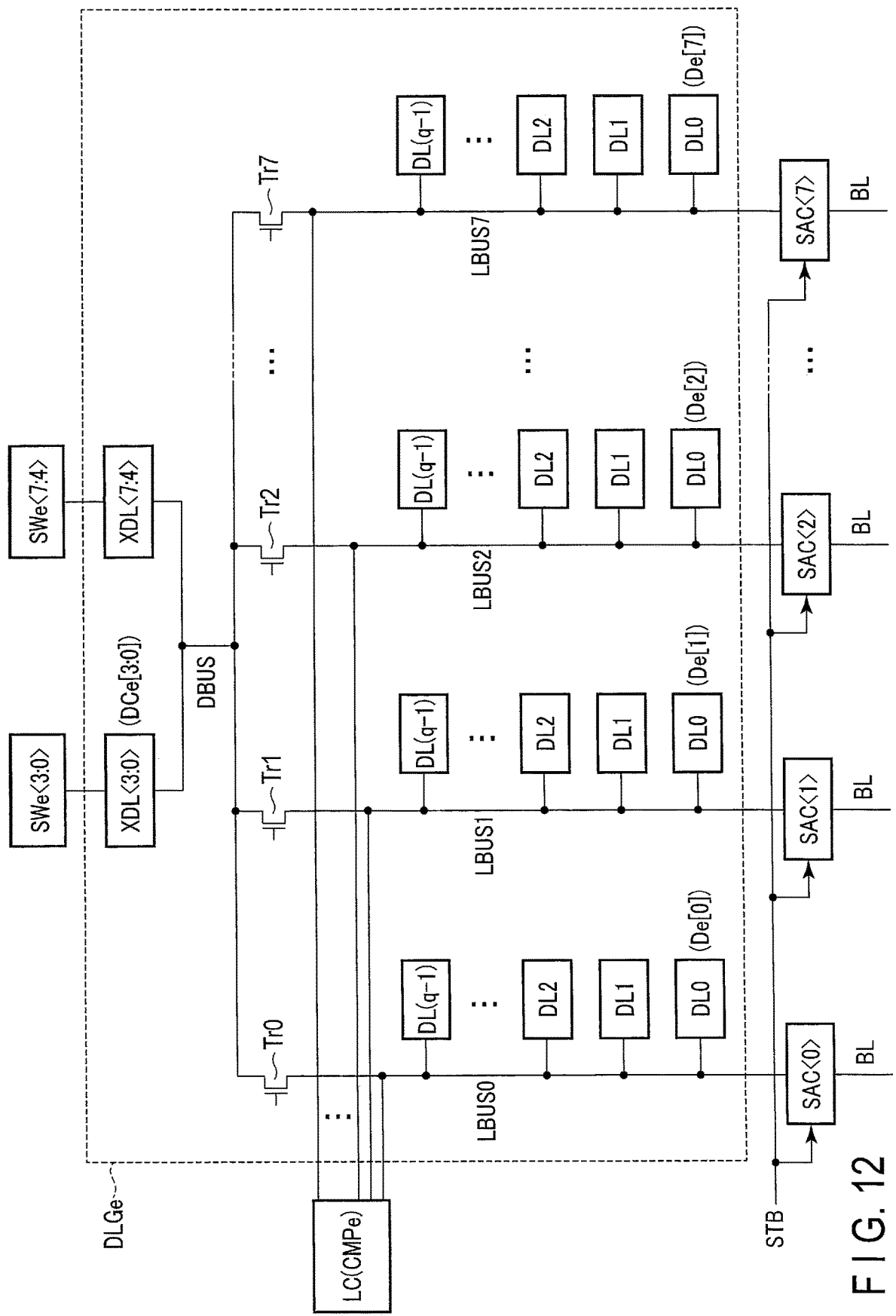
F I G. 12

Conversion steps
ST01: IO[2] = IO[4] | IO[2]
ST02: IO[3] = IO[5] | IO[3]
ST03: IO[3] = IO[6] | IO[3]
ST04: IO[3] = IO[7] | IO[3]
ST05: IO[0] = IO[4] | IO[0]
ST06: IO[0] = IO[5] | IO[0]
ST07: IO[1] = IO[6] | IO[1]
ST08: IO[2] = IO[7] | IO[2]
F I G. 15
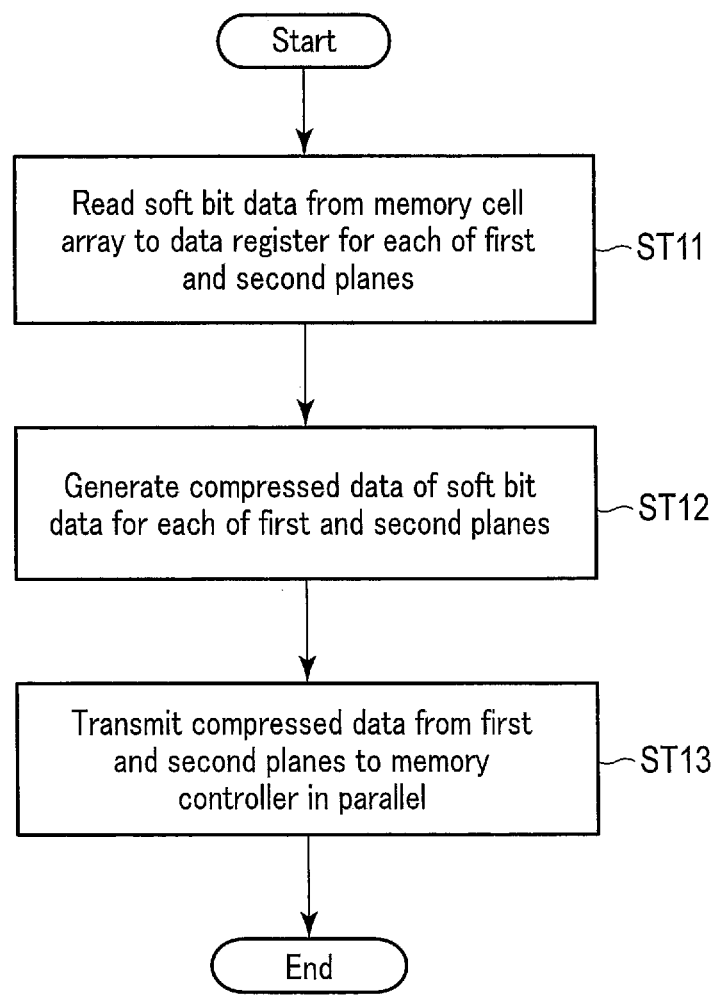
F I G. 16

FIG. 19

"1" Data

|  | IO[7] | IO[6] | IO[5] | IO[4] | IO[3] | IO[2] | IO[1] | IO[0] |  | IO[3] | IO[2] | IO[1] | IO[0] |  |
|---|---|---|---|---|---|---|---|---|---|---|---|---|---|---|
| (CS02) IO[0], IO[2] | 0 | 0 | 0 | 0 | 0 | 1 | 0 | 1 | → | 0 | 1 | 0 | 1 | Matched with results obtained when only IO[4] is "1" data |
| (CS03) IO[0], IO[3] | 0 | 0 | 0 | 0 | 1 | 0 | 0 | 1 | → | 1 | 0 | 0 | 1 | Matched with results obtained when only IO[5] is "1" data |
| (CS13) IO[1], IO[3] | 0 | 0 | 0 | 0 | 1 | 0 | 1 | 0 | → | 1 | 0 | 1 | 0 | Matched with results obtained when only IO[6] is "1" data |
| (CS23) IO[2], IO[3] | 0 | 0 | 0 | 0 | 1 | 1 | 0 | 0 | → | 1 | 1 | 0 | 0 | Matched with results obtained when only IO[7] is "1" data |

"1" Data of one bit is correctly detected

"1" Data

|  | IO[7] | IO[6] | IO[5] | IO[4] | IO[3] | IO[2] | IO[1] | IO[0] |  | IO[3] | IO[2] | IO[1] | IO[0] |  |
|---|---|---|---|---|---|---|---|---|---|---|---|---|---|---|
| (CS04) IO[0], IO[4] | 0 | 0 | 1 | 0 | 0 | 0 | 0 | 1 | → | 0 | 1 | 0 | 1 | Matched with results obtained when only IO[4] is "1" data |
| (CS05) IO[0], IO[5] | 0 | 0 | 1 | 0 | 0 | 0 | 0 | 1 | → | 1 | 0 | 0 | 1 | Matched with results obtained when only IO[5] is "1" data |
| (CS16) IO[1], IO[6] | 0 | 1 | 0 | 0 | 0 | 0 | 1 | 0 | → | 1 | 0 | 1 | 0 | Matched with results obtained when only IO[6] is "1" data |
| (CS24) IO[2], IO[4] | 0 | 0 | 0 | 1 | 0 | 1 | 0 | 0 | → | 0 | 1 | 0 | 1 | Matched with results obtained when only IO[4] is "1" data |
| (CS27) IO[2], IO[7] | 1 | 0 | 0 | 0 | 0 | 1 | 0 | 0 | → | 1 | 1 | 0 | 0 | Matched with results obtained when only IO[7] is "1" data |
| (CS35) IO[3], IO[5] | 0 | 0 | 1 | 0 | 1 | 0 | 0 | 0 | → | 1 | 0 | 1 | 0 | Matched with results obtained when only IO[5] is "1" data |
| (CS36) IO[3], IO[6] | 0 | 1 | 0 | 0 | 1 | 0 | 0 | 0 | → | 1 | 0 | 1 | 0 | Matched with results obtained when only IO[6] is "1" data |
| (CS37) IO[3], IO[7] | 1 | 0 | 0 | 0 | 1 | 0 | 0 | 0 | → | 1 | 1 | 0 | 0 | Matched with results obtained when only IO[7] is "1" data |

FIG. 20

| "1" Data | IO[7] | IO[6] | IO[5] | IO[4] | IO[3] | IO[2] | IO[1] | IO[0] | | IO[3] | IO[2] | IO[1] | IO[0] | |
|---|---|---|---|---|---|---|---|---|---|---|---|---|---|---|
| (CS01) IO[0], IO[1] | 0 | 0 | 0 | 0 | 0 | 0 | 1 | 1 | → | 0 | 0 | 1 | 1 | Detected as irregular data |
| (CS12) IO[1], IO[2] | 0 | 0 | 0 | 0 | 0 | 1 | 1 | 0 | → | 0 | 1 | 1 | 0 | Detected as irregular data |
| (CS14) IO[1], IO[4] | 0 | 0 | 0 | 1 | 0 | 1 | 0 | 0 | → | 0 | 1 | 1 | 1 | Detected as irregular data |
| (CS06) IO[0], IO[6] | 0 | 1 | 0 | 0 | 0 | 0 | 0 | 1 | → | 1 | 0 | 1 | 1 | Detected as irregular data |
| (CS15) IO[0], IO[5] | 0 | 0 | 1 | 0 | 0 | 0 | 1 | 0 | → | 1 | 0 | 1 | 1 | Detected as irregular data |
| (CS56) IO[5], IO[6] | 0 | 1 | 1 | 0 | 0 | 0 | 0 | 0 | → | 1 | 0 | 1 | 1 | Detected as irregular data |
| (CS07) IO[0], IO[7] | 1 | 0 | 0 | 0 | 0 | 0 | 0 | 1 | → | 1 | 1 | 0 | 1 | Detected as irregular data |
| (CS25) IO[2], IO[5] | 0 | 0 | 1 | 0 | 0 | 1 | 0 | 0 | → | 1 | 1 | 0 | 1 | Detected as irregular data |
| (CS34) IO[3], IO[4] | 0 | 0 | 0 | 1 | 1 | 0 | 0 | 0 | → | 1 | 1 | 0 | 1 | Detected as irregular data |
| (CS45) IO[4], IO[5] | 0 | 0 | 1 | 1 | 0 | 0 | 0 | 0 | → | 1 | 1 | 0 | 1 | Detected as irregular data |
| (CS47) IO[4], IO[7] | 1 | 0 | 0 | 1 | 0 | 0 | 0 | 0 | → | 1 | 1 | 0 | 1 | Detected as irregular data |
| (CS57) IO[5], IO[7] | 1 | 0 | 1 | 0 | 0 | 0 | 0 | 0 | → | 1 | 1 | 0 | 1 | Detected as irregular data |
| (CS17) IO[1], IO[7] | 1 | 0 | 0 | 0 | 0 | 0 | 1 | 0 | → | 1 | 1 | 1 | 0 | Detected as irregular data |
| (CS26) IO[2], IO[6] | 0 | 1 | 0 | 0 | 0 | 1 | 0 | 0 | → | 1 | 1 | 1 | 0 | Detected as irregular data |
| (CS67) IO[6], IO[7] | 1 | 1 | 0 | 0 | 0 | 0 | 0 | 0 | → | 1 | 1 | 1 | 0 | Detected as irregular data |
| (CS46) IO[4], IO[6] | 0 | 1 | 0 | 1 | 0 | 0 | 0 | 0 | → | 1 | 1 | 1 | 1 | Detected as irregular data |

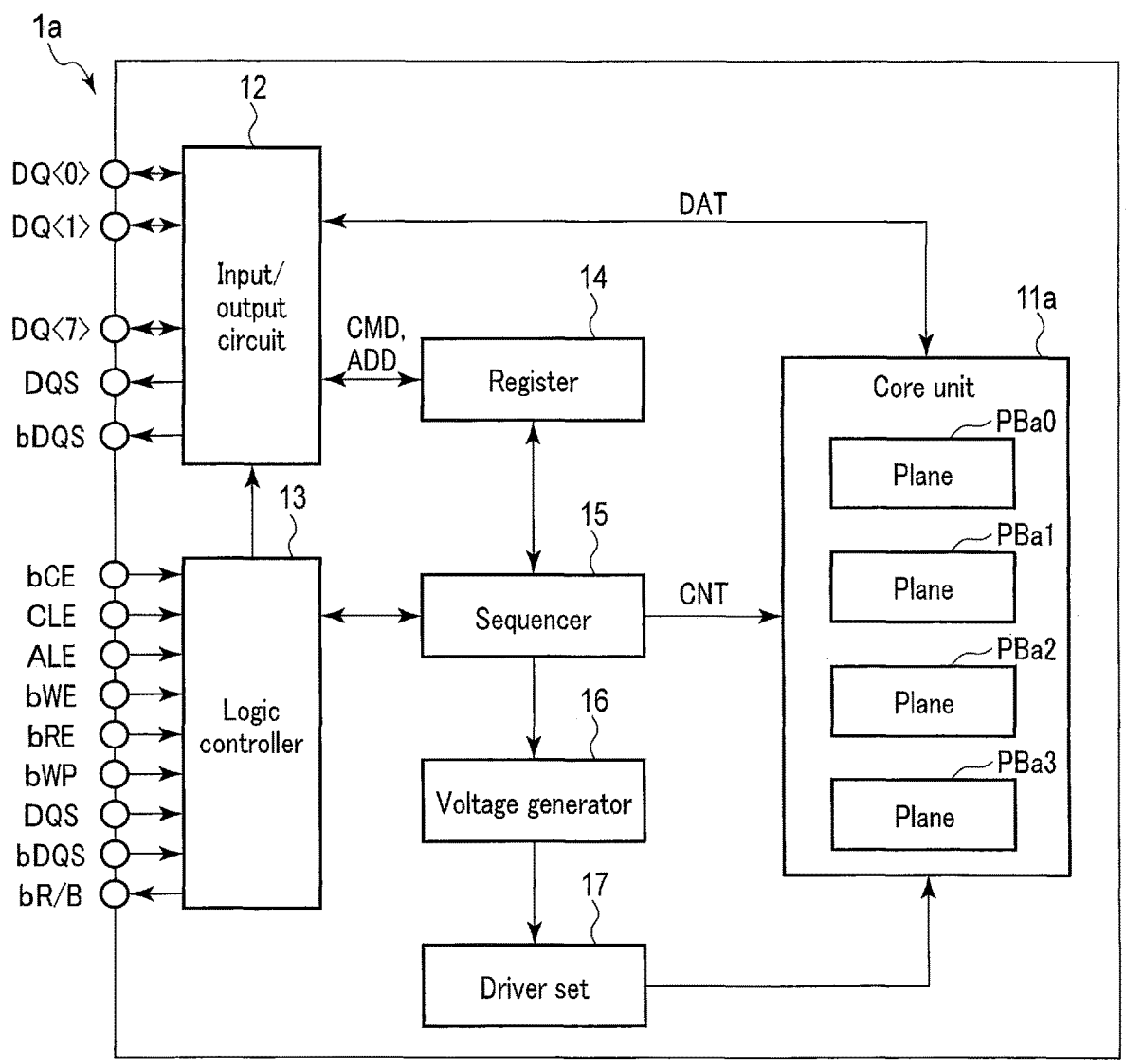
F I G. 21

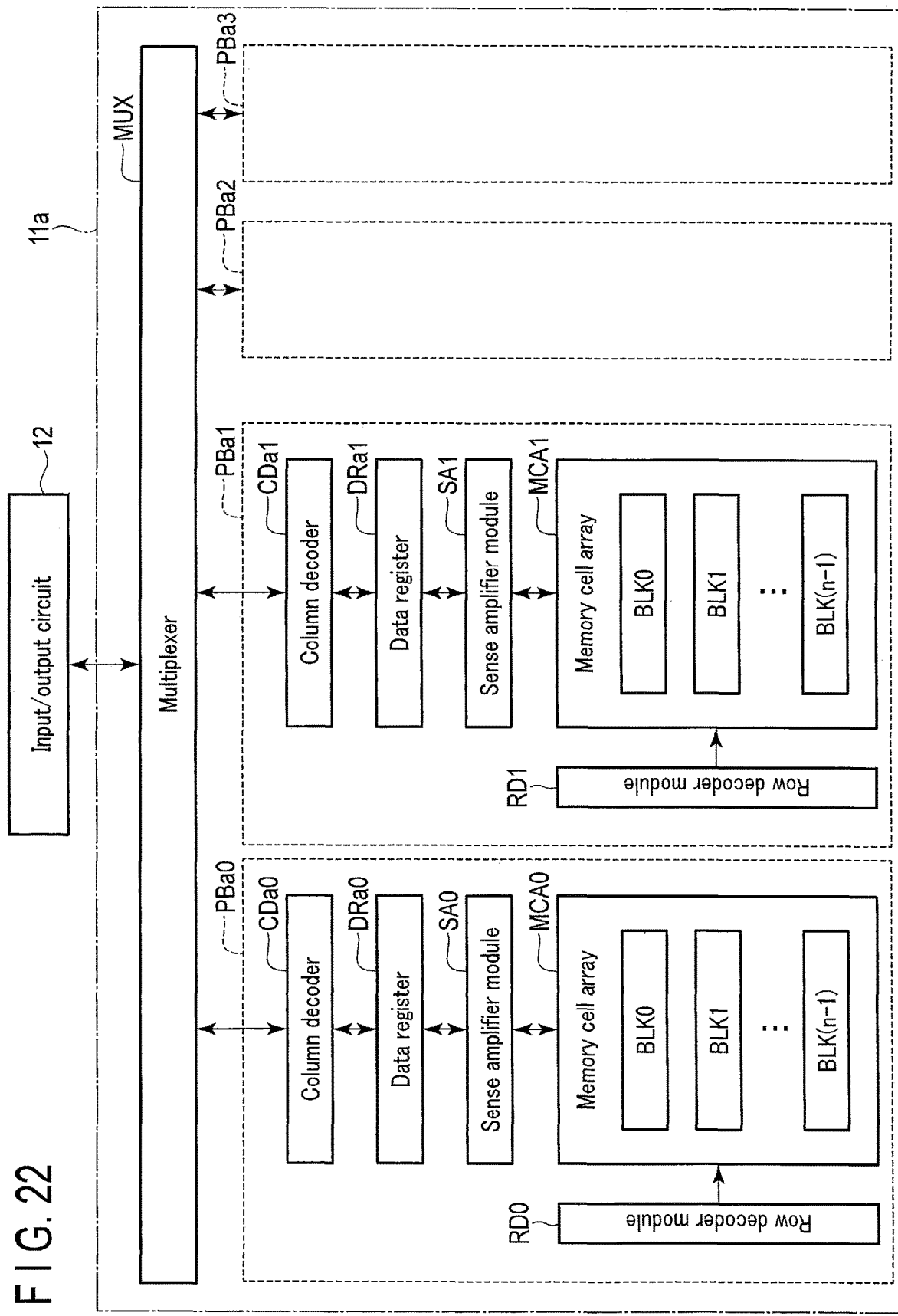
F I G. 22

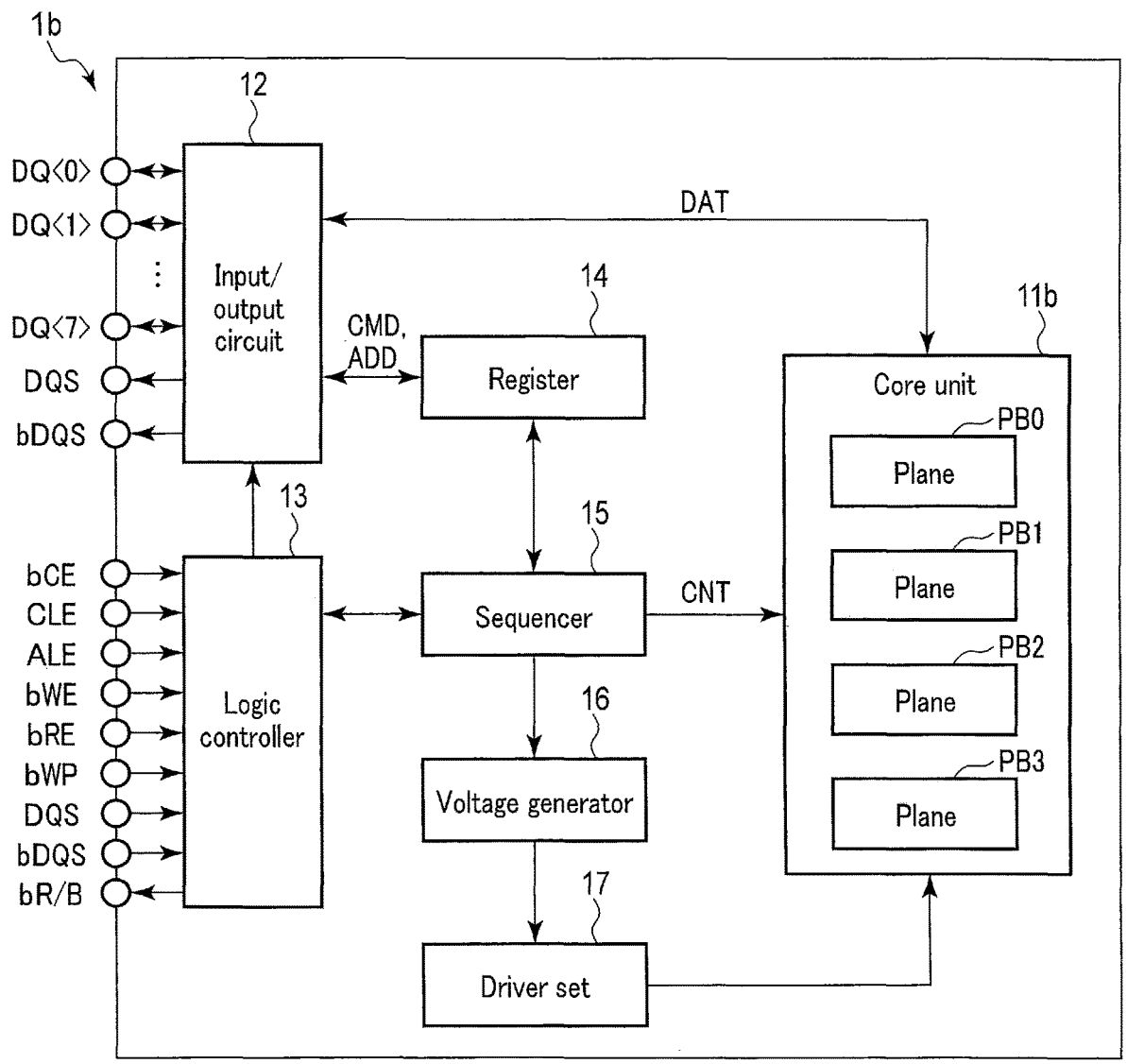
F I G. 26

SEMICONDUCTOR MEMORY DEVICE OUTPUTTING DATA FROM MEMORY CELL GROUPS IN PARALLEL AND SYSTEM

CROSS-REFERENCE TO RELATED APPLICATIONS

This application is based upon and claims the benefit of priority from Japanese Patent Application No. 2021-163427, filed Oct. 4, 2021, the entire contents of which are incorporated herein by reference.

FIELD

Embodiments described herein relate generally to a semiconductor memory device and a system.

BACKGROUND

A NAND flash memory is known as a semiconductor memory device.

BRIEF DESCRIPTION OF THE DRAWINGS

FIG. 1 is a block diagram illustrating an example of a configuration of a memory system including a semiconductor memory device according to a first embodiment;

FIG. 2 is a block diagram illustrating an example of a configuration of the semiconductor memory device according to the first embodiment;

FIG. 4 illustrates an example of a circuit configuration of a certain memory cell array of the semiconductor memory device according to the first embodiment;

FIG. 10 illustrates an example of a configuration for data transfer from the division to the input/output circuit in the semiconductor memory device 1 according to the first embodiment;

FIG. 12 illustrates an example of the configuration of the data latch group of the data register circuit of the division of the semiconductor memory device according to the first embodiment;

FIG. 15 illustrates conversion steps of converting data into compressed data;

FIG. 16 is a flowchart illustrating an operation example in which the semiconductor memory device according to the first embodiment executes a read operation and a data output operation;

FIG. 19 is a diagram for describing compressed data generated by a compression circuit of a semiconductor memory device according to a modification of the first embodiment;

FIG. 20 is a diagram for further describing compressed data generated by a compression circuit of the semiconductor memory device according to the modification of the first embodiment;

FIG. 21 is a block diagram illustrating an example of a configuration of a semiconductor memory device according to a second embodiment;

FIG. 22 is a block diagram illustrating an example of a configuration of a core unit of the semiconductor memory device according to the second embodiment;

FIG. 26 is a block diagram illustrating an example of a configuration of a semiconductor memory device according to a third embodiment;

DETAILED DESCRIPTION

Figure 3:
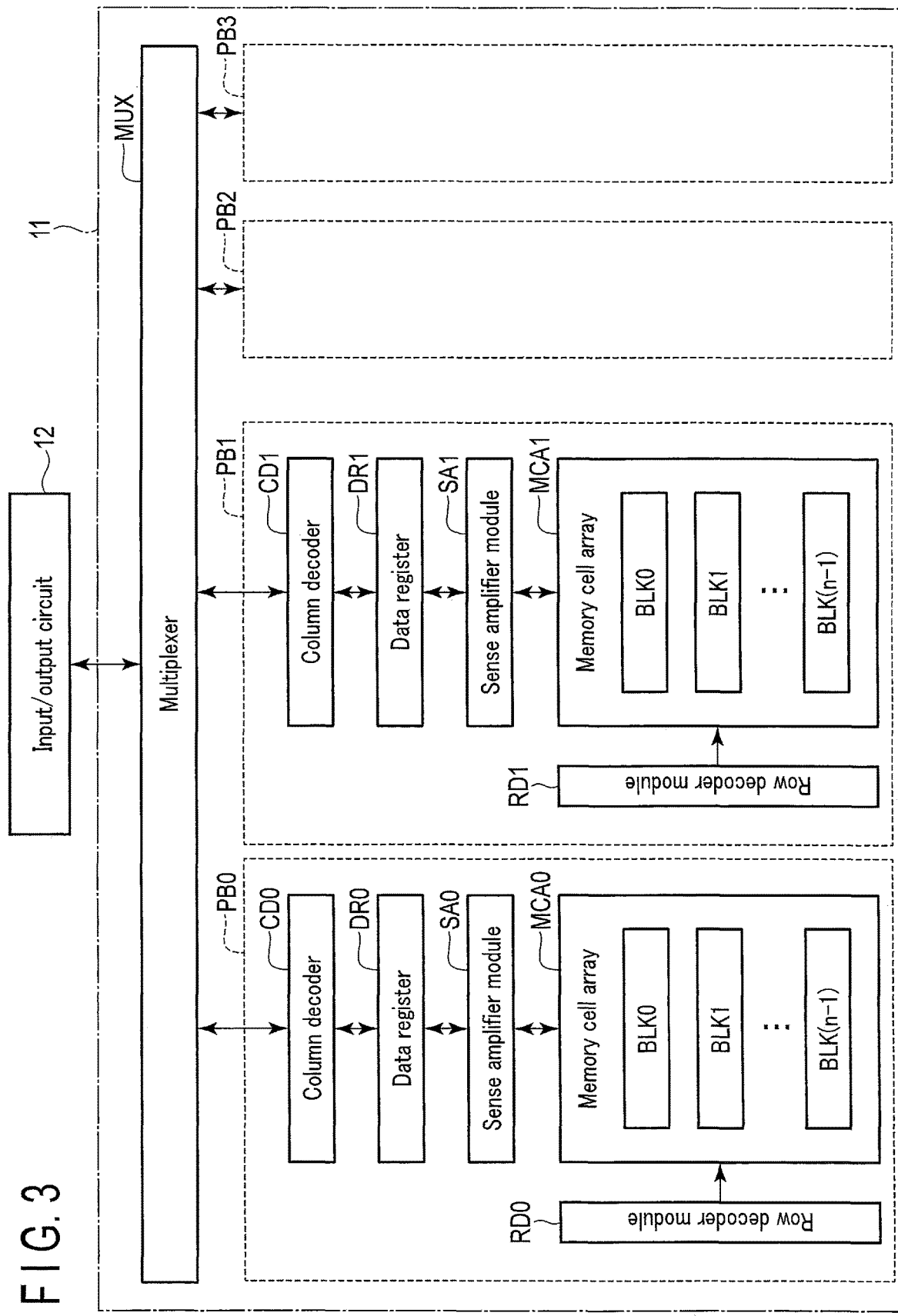
FIG. 3 is a block diagram illustrating an example of a configuration of a core unit of the semiconductor memory device according to the first embodiment.

In general, according to one embodiment, a semiconductor memory device includes: a core unit; and a control circuit. The core unit includes a first memory cell group and a second memory cell group. The control circuit is configured to, in response to a read command including designation of a first address and designation of a second address, read first data from the first memory cell group, read second data from the second memory cell group, and output third data and fourth data in parallel. The first address corresponds to the first memory cell group. The second address corresponds to the second memory cell group. The designation of the second address is made after the designation of the first address. The third data corresponds to the read first data. The fourth data corresponds to the read second data.

Hereinafter, embodiments will be described with reference to the drawings. In the following description, components having the same functions and configurations are denoted by the same reference signs. In a case where a plurality of components having a common reference sign is distinguished, suffixes are added to the common reference sign to distinguish the components from each other. In a case where a plurality of components does not need to be particularly distinguished, only a common reference sign is given to the plurality of components, and suffixes are not added.

Each functional block can be implemented by any one of hardware and software or a combination of both. In addition, it is not essential that each functional block is distinguished as described below. For example, some functions may be executed by a functional block different from the exemplary functional blocks. Further, the exemplary functional blocks may be divided into finer functional sub-blocks. In addition, the names of the functional blocks and the components in the following description are for convenience, and do not limit configurations and operations of the functional blocks and the components.

First Embodiment

A semiconductor memory device 1 according to a first embodiment will be described below.

EXAMPLE OF CONFIGURATION (1) Memory System

FIG. 1 is a block diagram illustrating an example of a configuration of a memory system 3 including the semiconductor memory device 1 according to the first embodiment. Reference signs 1a, 1b, 3a, and 3b illustrated in FIG. 1 are referred to in the description according to the subsequent embodiments.

The memory system 3 includes the semiconductor memory device 1 and a memory controller 2 and is controlled by a host device 4. The memory system 3 is, for example, a memory card such as an SD™ card, a solid state drive (SSD), or the like.

The semiconductor memory device 1 is controlled by the memory controller 2. The memory controller 2 receives a host command from the host device 4 and controls the semiconductor memory device 1 based on the host command. By the control, various operations such as an operation (hereinafter referred to as a write operation) of storing write data in a memory cell array of the semiconductor memory device 1 and an operation (hereinafter referred to as a read operation) of reading read data from a memory cell array of the semiconductor memory device 1 are executed.

The memory controller 2 includes a host interface circuit 21, a central processing unit (CPU) 22, a random access memory (RAM) 23, a read only memory (ROM) 24, a memory interface circuit 25, and an error check and correction (ECC) circuit 26. The memory controller 2 is configured as, for example, a system-on-a-chip (SoC).

The host interface circuit 21 is coupled to the host device 4 via a host interface and manages communication between the memory controller 2 and the host device 4. For example, the host interface circuit 21 receives a host command sent from the host device 4 to the memory controller 2.

The ROM 24 stores firmware (program). The RAM 23 can hold the firmware and is used as a work area of the CPU 22. The firmware stored in the ROM 24 and loaded on the RAM 23 is executed by the CPU 22. As a result, the memory controller 2 executes various operations including the write operation, the read operation, and the like, and some of functions of the host interface circuit 21 and the memory interface circuit 25.

The RAM 23 further temporarily holds data and functions as a buffer and a cache, for example. A portion of the RAM 23 that functions as the buffer will be described as a data buffer 231. The data buffer 231 receives write data transmitted from the host device 4 via the host interface circuit 21, and temporarily holds the write data. The data buffer 231 further temporarily holds read data to be transmitted to the host device 4 via the host interface circuit 21. The data buffer 231 may be a volatile memory or a nonvolatile memory.

The memory interface circuit 25 is coupled to the semiconductor memory device 1 via a memory interface and manages communication between the memory controller 2 and the semiconductor memory device 1. The memory interface transmits, for example, a chip enable signal bCE, a command latch enable signal CLE, an address latch enable signal ALE, a write enable signal bWE, a read enable signal bRE, a write protect signal bWP, a ready/busy signal bR/B, input/output timing control signals DQS and bDQS, and signals DQ<0> to DQ<7>. Hereinafter, the signals DQ<0> to DQ<7> are referred to as signals DQ<7:0>. Hereinafter, the same applies to a case where similar notation is used for reference signs attached to other components unless otherwise specified.

The signals DQS and bDQS have the following relationship. The voltage of the signal bDQS is at its low (L) level while the voltage of the signal DQS is at its high (H) level. The voltage of the signal bDQS is at its H level while the voltage of the signal DQS is at its L level. In the following description, when the term "level" is used in relation to a signal, the reference is made to the level of the voltage of the signal, unless otherwise noted.

For example, the memory interface circuit 25 generates a command set based on a host command from the host device 4 and transmits the command set to the semiconductor memory device 1 via the signals DQ<7:0>. The command set includes, for example, a command CMD and address information ADD. The command set may include write data DAT in addition to the command CMD and the address information ADD. On the other hand, the memory interface circuit 25 receives read data DAT transmitted from the semiconductor memory device 1 via the signals DQ<7:0>. In the present specification, in order to facilitate reference, both write data and read data transmitted and received by the memory interface circuit 25 will be described with reference sign DAT. Hereinafter, the write data and the read data may be collectively referred to as data DAT.

The error check and correction circuit 26 receives write data held in the data buffer 231. The error check and correction circuit 26 adds an error correction code to the write data. The write data with the error correction code added thereto is the write data DAT. The error check and correction circuit 26 supplies the write data DAT to, for example, the data buffer 231, the memory interface circuit 25, or the like.

The error check and correction circuit 26 receives the read data DAT transmitted from the semiconductor memory device 1 via the memory interface circuit 25. The error check and correction circuit 26 determines whether an error is present in the read data DAT based on the error correction code. When the error check and correction circuit 26 determines that the error is present in the read data DAT, the error check and correction circuit 26 executes error correction processing on the read data DAT based on the error correction code. The error check and correction circuit 26 supplies the read data after the error correction processing to, for example, the data buffer 231 or the like.

(2) Semiconductor Memory Device

FIG. 2 is a block diagram illustrating an example of a configuration of the semiconductor memory device 1 according to the first embodiment. The semiconductor memory device 1 according to the first embodiment is, for example, a NAND flash memory capable of storing data in a nonvolatile manner.

The semiconductor memory device 1 includes a core unit 11, an input/output circuit 12, a logic controller 13, a register 14, a sequencer 15, a voltage generator 16, and a driver set 17.

The core unit 11 includes a plurality of planes PB. In the present specification, the core unit 11 is described as including four planes PB0, PB1, PB2, and PB3, but the number of planes PB included in the core unit 11 is not limited to four. Each plane PB includes a memory cell array. In the semiconductor memory device 1, various operations such as a write operation of storing write data DAT in a memory cell array of a plane and a read operation of reading read data DAT from a memory cell array of a plane are executed.

The input/output circuit 12 controls input and output of the signals DQ<7:0> from and to the memory controller 2, and controls output of the signal DQS and the signal bDQS. The signals DQ<7:0> include, for example, the command CMD, the data DAT, and the address information ADD. The command CMD includes, for example, a command for causing the semiconductor memory device 1 to execute processing according to a host command from the host device 4. The address information ADD includes, for example, a column address and a row address. The row address includes, for example, a block address, a page address, and a plane address. The plane address is included in, for example, the block address. In the following description, it is assumed that the block address includes the plane address. The signals DQS and bDQS that can be controlled by the input/output circuit 12 are used to enable the input of the signals DQ<7:0> by the memory interface circuit 25.

The input and output of the signals DQ<7:0> by the input/output circuit 12 will be described more specifically. The input/output circuit 12 receives the write data DAT, the command CMD, and the address information ADD from the memory controller 2, transfers the write data DAT to the core unit 11, and transfers the address information ADD and the command CMD to the register 14. The input/output circuit 12 receives the read data DAT from the core unit 11. The input/output circuit 12 transmits the read data DAT to the memory controller 2 while toggling the signals DQS and bDQS between the H level and the L level.

The logic controller 13 receives, for example, the chip enable signal bCE, the command latch enable signal CLE, the address latch enable signal ALE, the write enable signal bWE, the read enable signal bRE, the write protect signal bWP, and the signals DQS and bDQS from the memory controller 2. The logic controller 13 controls the input/output circuit 12 and the sequencer 15 based, on the received signals.

The chip enable signal bCE is used to enable the semiconductor memory device 1. The command latch enable signal CLE is used to notify the input/output circuit 12 of a period in which the command CMD is transmitted via the signals DQ<7:0> input to the semiconductor memory device 1. The address latch enable signal ALE is used to notify the input/output circuit 12 of a period in which the address information ADD is transmitted via the signals DQ<7:0> input to the semiconductor memory device 1. The write enable signal bWE and the read enable signal bRE are used to enable the input and output of the signals DQ<7:0> by the input/output circuit 12, respectively. The write protect signal bWP is used to prohibit writing and erasing of data in the semiconductor memory device 1. The signals DQS and bDQS input to the logic controller 13 are used to enable the input of the signals DQ<7:0> by the input/output circuit 12. The signals DQS and bDQS are toggled between the H level and the L level by the memory controller 2 while the write data DAT is transmitted via the signals DQ<7:0>, for example.

The logic controller 13 generates a ready/busy signal bR/B according to control by the sequencer 15 and transmits the ready/busy signal bR/B to the memory controller 2. The ready/busy signal bR/B is used to notify the memory controller 2 whether the semiconductor memory device 1 is in the ready state or the busy state. In the ready state, the semiconductor memory device 1 accepts a command from the memory controller 2. In the busy state, the semiconductor memory device 1 does not accept a command from the memory controller 2 with an exception.

The register 14 holds the command CMD and the address information ADD transferred from the input/output circuit 12. For example, the register 14 transfers the command CMD and the address information ADD to the sequencer 15.

The sequencer 15 controls the entire operation of the semiconductor memory device 1 based on the command CMD held in the register 14. For example, the sequencer 15 generates a control signal CNT based on the address information ADD held in the register 14 and transmits the control signal CNT to the core unit 11. The control signal CNT includes, for example, a block address. The control signal CNT enables control of a target plane PB among the plurality of planes PB included in the core unit 11. The sequencer 15 controls the voltage generator 16, the driver set 17, and the target plane PB, and executes various operations such as a write operation, a read operation, and an erase operation on data for the target plane PB.

The voltage generator 16 generates various voltages to be used for the write operation, the read operation, the erase operation, and the like based on control by the sequencer 15 and supplies the generated voltages to the driver set 17.

The driver set 17 transfers, for example, the various voltages to be used for the write operation, the read operation, and the like to the core unit 11 based on the voltages and the like supplied from the voltage generator 16.

(3) Core Unit and Planes

FIG. 3 is a block diagram illustrating an example of a configuration of the core unit 11 of the semiconductor memory device 1 according to the first embodiment.

The core unit 11 includes a multiplexer MUX in addition to the planes PB0, PB1, PB2, and PB3. The multiplexer MUX selects a plane PB to be subjected to various operations such as the read operation and the write operation based on, for example, the control signal CNT. The multiplexer MUX enables the transfer of the data DAT between the selected plane PB and the input/output circuit 12.

The plane PB0 includes a memory cell array MCA0, a row decoder module RD0, a column decoder CD0, a data register DR0, and a sense amplifier module SA0.

The memory cell array MCA0 includes blocks BLK0 to BLK(n−1) (n is a natural number). Each of the blocks BLK includes a plurality of nonvolatile memory cells associated with bit lines and word lines, and is, for example, a data erasure unit. In the semiconductor memory device 1, for example, a single-level cell (SLC) method, a multi-level cell (MLC) method, a triple-level cell (TLC) method, or a quad-level cell (QLC) method can be applied. In the SLC method, 1-bit data is stored in each memory cell. In the MLC method, 2-bit data is stored in each memory cell. In the TLC method, 3-bit data is stored in each memory cell. In the QLC method, 4-bit data is stored in each memory cell. Note that data of 5 bits or more may be stored in each memory cell.

The row decoder module RD0 selects a block BLK or the like to be subjected to various operations such as the read operation and the write operation based on the block address in the address information ADD held in the register 14. The row decoder module RD0 can transfer the various voltages supplied from the driver set 17 to the selected block BLK.

The column decoder CD0 transfers the write data DAT transferred from the input/output circuit 12 via the multiplexer MUX to the data register DR0 based on the column address in the address information ADD held in the register 14. The column decoder CD0 transfers the read data DAT transferred from the data register DR0 to the input/output circuit 12 via the multiplexer MUX based on the column address in the address information ADD held in the register 14.

The data register DR0 includes, for example, a plurality of data latch circuits functioning as a cache memory. The data register DR0 receives the write data DAT transferred from the column decoder CD0, and causes the plurality of data latch circuits to temporarily hold the write data DAT. The data register DR0 generates read data DAT based on data transferred from the sense amplifier module SA0, and causes the plurality of data latch circuits to temporarily hold the read data DAT.

The sense amplifier module SA0 transfers the write data DAT held in the data register DR0 to the memory cell array MCA0. The sense amplifier module SA0 senses a signal relating to a threshold voltage of each of a plurality of memory cell transistors in the memory cell array MCA0, and transfers, for example, data based on the sensing to the data register DR0.

Although the configuration of the plane PB0 has been described above, each of the other planes PB has a configuration similar to that described for the plane PB0, for example. In FIG. 3, for example, the plane PB1 includes a memory cell array MCA1, a row decoder module RD1, a column decoder CD1, a data register DR1, and a sense amplifier module SA1.

(4) Memory Cell Arrays

The configuration of the memory cell array MCA0 of the plane PB0 will be described in detail. The memory cell array MCA of each of the planes PB included in the core unit 11 may have a configuration similar to that described below.

FIG. 4 illustrates an example of a circuit configuration of the memory cell array MCA0 of the semiconductor memory device 1 according to the first embodiment. An example of a circuit configuration of a certain block BLK included in the memory cell array MCA0 is illustrated as an example of the circuit configuration of the memory cell array MCA0. Each of the other blocks BLK included in the memory cell array MCA0 may have a circuit configuration similar to that illustrated in FIG. 4.

The block BLK includes, for example, four string units SU0 to SU3. Each string unit SU includes a plurality of NAND strings NS. The plurality of NAND strings NS is associated with a number m (m is a natural number) of bit lines BL0 to BL(m−1) on a one-to-one basis. Each NAND string NS is coupled to the bit line BL associated with the NAND string NS and includes, for example, memory cell transistors MT0 to MT7 and select transistors ST1 and ST2. Each memory cell transistor MT includes a control gate (hereinafter also referred to as a gate) and a charge storage layer, and stores data in a nonvolatile manner. Each of the select transistors ST1 and ST2 is used to select the NAND string NS including the select transistors ST1 and ST2 during various operations.

The drain of the select transistor ST1 of each NAND string NS is coupled to the bit line BL associated with the NAND string NS. The memory cell transistors MT0 to MT7 are coupled in series between the source of the select transistor ST1 and the drain of the select transistor ST2 of the NAND string NS. The source of the select transistor ST2 is coupled to a source line SL.

Interconnects coupled to the gates of the select transistors ST1 and ST2 and the gates of the memory cell transistors MT0 to MT7 will be described using an integer j and an integer k. The following description holds for each case where j is an integer from 0 to 3 and for each case where k is an integer from 0 to 7 in the example of FIG. 4.

The gates of the select transistors ST1 of the NAND strings NS included in the string unit SUj are commonly coupled to a select gate line SGDj. The gates of the select transistors ST2 of the NAND strings NS included in the block BLK are commonly coupled to a select gate line SGS. The gates of the memory cell transistors MTk of the NAND strings NS included in the block BLK are commonly coupled to word lines WLk.

Each of the bit lines BL is coupled to the drain of the select transistor ST1 of the NAND string NS included in and associated with each of the string units SU of the block BLK. For example, these bit lines BL are coupled in the other blocks BLK of the memory cell array MCA0 in a similar manner and are shared between the blocks BLK. Such bit lines BL are provided for each plane PB, for example. In this case, for example, the same bit lines BL are not shared between the blocks BLK of the other planes PB as described above.

The source line SL is commonly coupled to the sources of the select transistors ST2 of the NAND strings NS included in the block BLK, thereby being shared between the string units SU of the block BLK. For example, the source line SL is coupled in the other blocks BLK in a similar manner and shared between the blocks BLK.

A set of memory cell transistors MT commonly coupled to a single word line WL in a single string unit SU is referred to as, for example, a cell unit CU. For example, a set of 1-bit data at the same digit stored in each of the memory cell transistors MT in the cell unit CU is referred to as, for example, a "1-page data item". For example, when data of a plurality of bits is stored in each memory cell by the MLC method or the like, a plurality of such "1-page data items" may be stored in a single cell unit CU.

Although the circuit configuration of the memory cell array MCA0 has been described above, the circuit configuration of the memory cell array MCA0 is not limited to that described above. For example, the number of string units SU included in each block BLK can be designed to be any number. In addition, the number of memory cell transistors MT included in each NAND string NS and the number of select transistors ST1 and ST2 included in each NAND string NS can be designed to be any number. The number of word lines WL and the number of select gate lines SGD and SGS are changed based on the number of memory cell transistors MT in each NAND string NS and the number of select transistors ST1 and ST2 in each NAND string NS.

(5) Threshold Voltage of Memory Cell Transistor

When a voltage applied to the gate of a memory cell transistor MT is increased, the memory cell transistor MT is switched from an OFF state to an ON state. The OFF state is a state in which a channel through which a current flows in the memory cell transistor MT is not formed, and the ON state is a state in which the channel is formed. The voltage at which the memory cell transistor MT is just switched from the OFF state to the ON state is referred to as a threshold voltage of the memory cell transistor MT. The threshold voltage may be a negative voltage.

Figure 5:
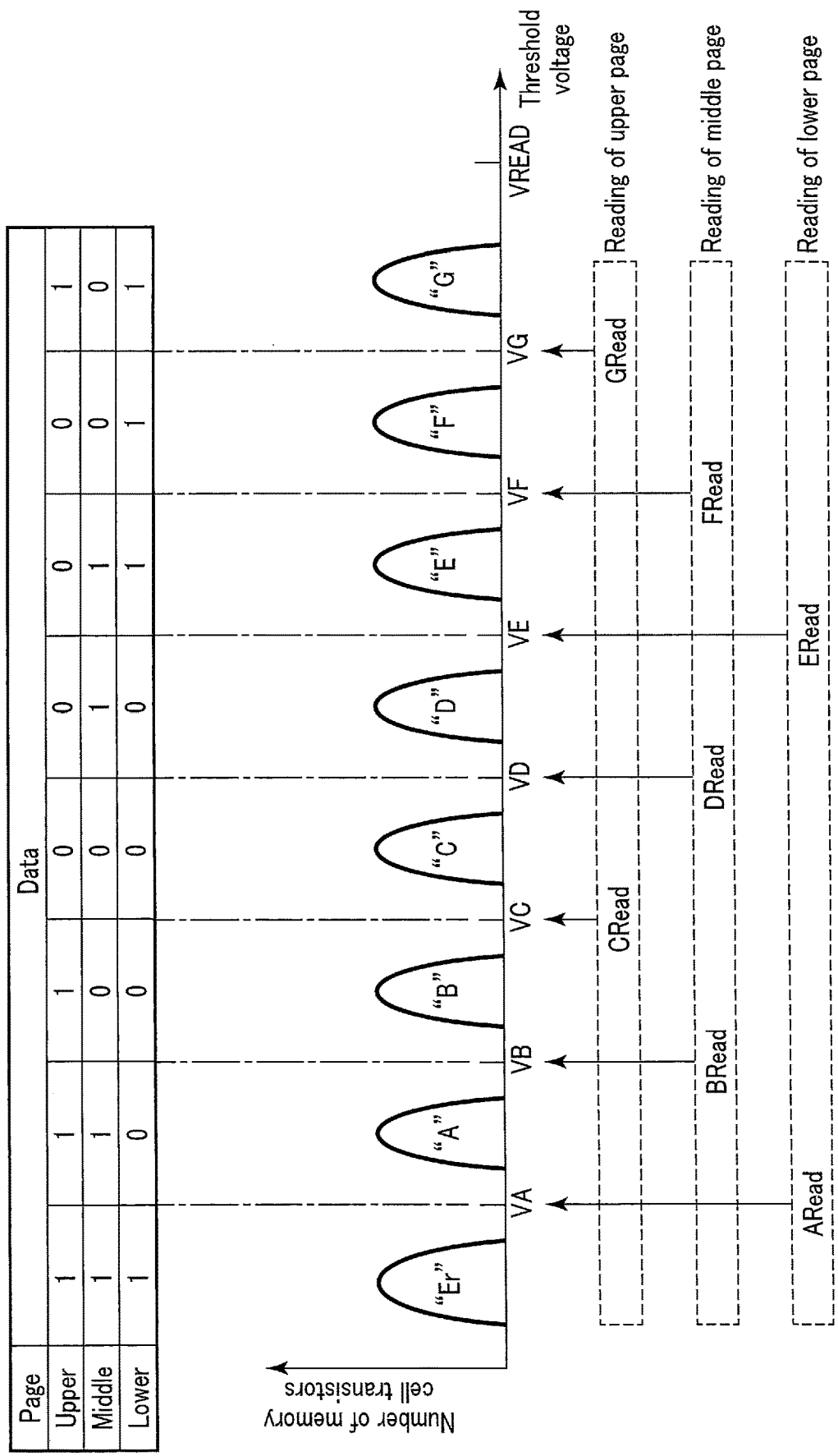
FIG. 5 illustrates an example of a threshold voltage distribution formed by memory cell transistors of the semiconductor memory device according to the first embodiment.

FIG. 5 illustrates an example of a threshold voltage distribution, data assignment, and a read voltage in a case where each memory cell transistor MT of the memory cell array MCA0 illustrated in FIG. 4 stores 3-bit data by the TLC method.

The memory cell transistor MT stores the 3-bit data based on the threshold voltage. In the write operation, a program operation is executed to increase the threshold voltage of the memory cell transistor MT by injecting electrons into the charge storage layer of the memory cell transistor MT.

FIG. 5 schematically illustrates an example of a graph in which the number of memory cell transistors MT in which the threshold voltage of each memory cell transistor MT is a certain value is plotted with the value as a variable as an example of eight threshold voltage distributions formed as a result of such control of the threshold voltage. The horizontal axis indicates the value of the threshold voltage of the memory cell transistor MT. The vertical axis indicates the number of memory cell transistors MT.

The eight threshold voltage distributions are respectively associated with, for example, an "Er" state, an "A" state, a "B" state, a "C" state, a "D" state, an "E" state, an "F" state, and a "G" state. According to the threshold voltage of the memory cell transistor MT, the memory cell transistor MT is distinguished as being in any one of these states. The threshold voltage of the memory cell transistor MT increases in the order the "Er" state, the "A" state, the "B" state, the "C" state, the "D" state, the "E" state, the "F" state, and the "G" state in which the memory cell transistor MT is. For example, the "Er" state is assigned "111" ("higher, middle, and lower bits") data, the "A" state is assigned "110" data, the "B" is assigned "100" data, the "C" state is assigned "000" data, the "D" state is assigned "010" data, the "E" state is assigned "011" data, the "F" state is assigned "001" data, and the "G" state is assigned "101" data. The data assigned to each of the states is stored in the memory cell transistor MT in the state.

In the read operation, it is determined which state the memory cell transistor MT is in. A read voltage used in the read operation is set. Specifically, a read voltage VA is set in association with the "A" state, a read voltage VB is set in association with the "B" state, a read voltage VC is set in association with the "C" state, a read voltage VD is set in association with the "D" state, a read voltage VE is set in association with the "E" state, a read voltage VF is set in association with the "F" state, and a read voltage VG is set in association with the "G" state.

A case where the read voltage VA is applied to the gate of a certain memory cell transistor MT is described below. When the memory cell transistor MT is in the ON state, it can be seen that the memory cell transistor MT is in the "Er" state. On the other hand, when the memory cell transistor MT is in the OFF state, the memory cell transistor MT is in any one of the "A" state, the "B" state, the "C" state, the "D" state, the "E" state, the "F" state, and the "G" state. Therefore, it is possible to determine whether the memory cell transistor MT is in the "Er" state or in any one of the "A" state, the "B" state, the "C" state, the "D" state, the "E" state, the "F" state, and the "G" state. The same applies to the other read voltages. In the following description, such determination is also referred to as reading.

Further, a read path voltage VREAD is set to be always higher than the threshold voltage of the memory cell transistor MT in the highest "G" state. When the read path voltage VREAD is applied to the gate of a certain memory cell transistor MT, the memory cell transistor MT is turned on regardless of stored data.

As described with reference to FIG. 4, a set of 1-bit data at the same digit stored in each of the memory cell transistors MT in a single cell unit CU constitutes a "1-page data item".

Data of a lower page that is a 1-page data item including a set of data of the lower bits is determined for the memory cell transistors MT of the cell unit CU based on results of reading (hereinafter, reading using a read voltage Vα (α is A, B, C, D, E, F, or G) is referred to as α reading) using the read voltage VA and E reading. This is specifically as follows.

For example, by the A reading, it is determined whether a memory cell transistor MT to be read is in the "Er" state or is in any one of the "A" state, the "B" state, the "C" state, the "D" state, the "E" state, the "F" state, and the "G" state. Subsequently, according to the E reading, it is determined whether the memory cell transistor MT to be read in the "A" state, the "B" state, the "C" state, the "D" state, the "E" state, the "F" state, or the "G" state is in the "A" state, the "B" state, the "C" state, or the "D" state, or is in the "E" state, the "F" state, or the "G" state. When the memory cell transistor MT to be read is in the "Er" state, the "E" state, the "F" state, or the "G" state, it is determined that "1" data is stored in the lower page. When the memory cell transistor MT is in the "A" state, the "B" state, the "C" state, or the "D" state, it is determined that "0" data is stored in the lower page.

The same applies to reading of data of a middle page of a set of data of the middle bits and data of an upper page of a set of data of the upper bits. In the reading of the data of the middle page, data stored in the middle page in each of the memory cell transistors MT to be read is determined by the B reading, the D reading, and the F reading. In the reading of the data of the upper page, data stored in the upper page in each of the memory cell transistors MT to be read is determined by the C reading and the G reading.

Note that the number of bits of data stored in a single memory cell transistor MT and the assignment of the data to the threshold voltage distributions described above are merely examples, and the embodiment is not limited thereto.

Figure 6:
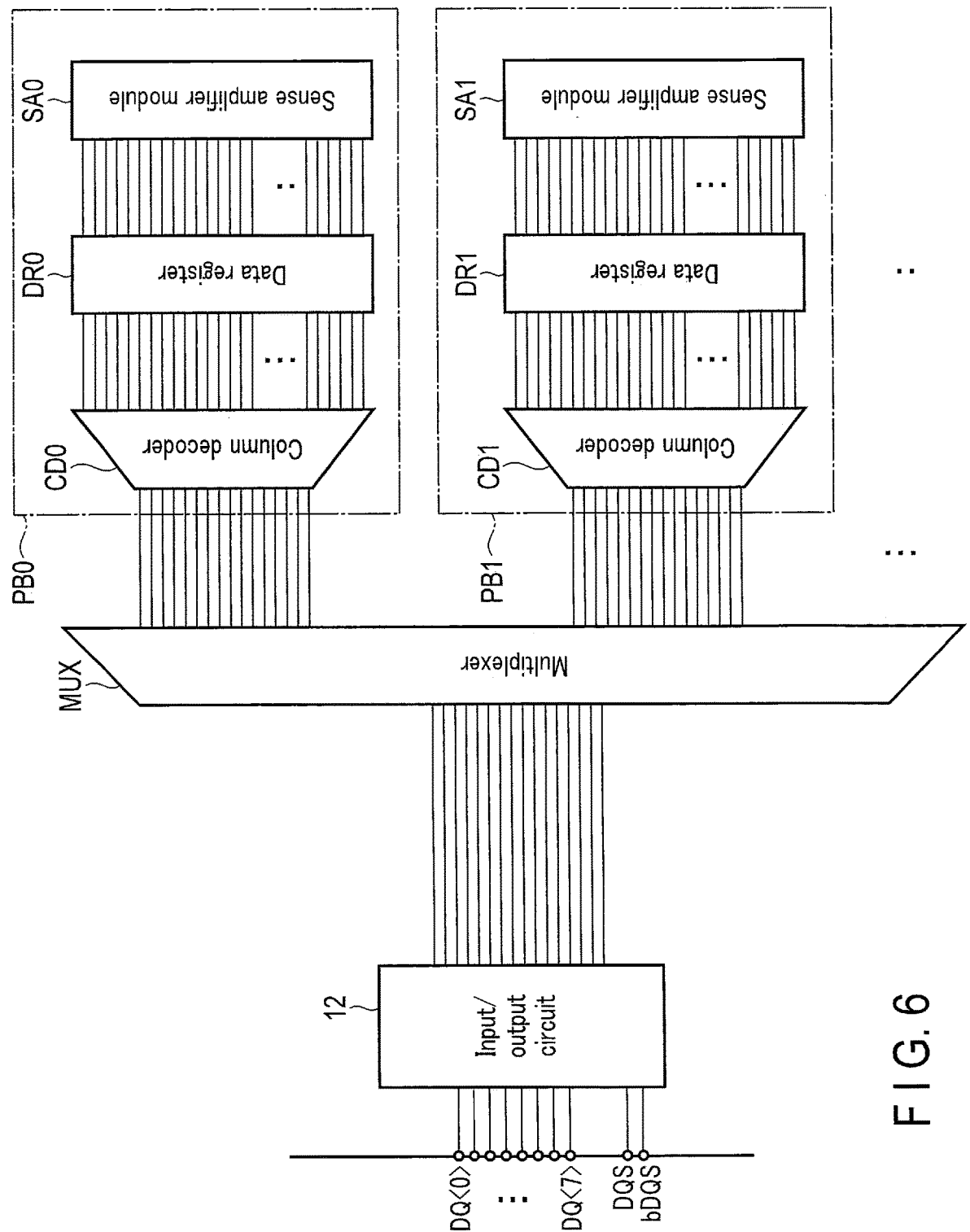
FIG. 6 is a diagram for describing a configuration for data transfer between an input/output circuit and planes in the semiconductor memory device according to the first embodiment.

(6) Schematic Configuration for Data Transfer Between Input/output Circuit and Planes FIG. 6 is a diagram for describing a configuration for data transfer between the input/output circuit 12 and the planes PB in the semiconductor memory device 1 according to the first embodiment.

The input/output circuit 12 receives write data DAT transmitted from the memory controller 2 via the signals DQ<7:0>. In the receipt of the write data DAT, for example, 16-bit data of the write data DAT is received every cycle of the toggled signals DQS and bDQS. The input/output circuit 12 transfers the write data DAT to the multiplexer MUX. The transfer of the write data DAT is performed, for example, every 16 bits.

The input/output circuit 12 receives the read data DAT transferred from the multiplexer MUX. The transfer of the read data DAT is performed, for example, every 16 bits. The input/output circuit 12 transmits the read data DAT to the memory controller 2 via the signals DQ<7:0>. In the transmission of the read data DAT, for example, 16-bit data of the read data DAT is transmitted every cycle of the toggled signals DQS and bDQS.

The multiplexer MUX selects a plane PB based on, for example, the control signal CNT. The multiplexer MUX transfers the write data DAT transferred from the input/output circuit 12 to the column decoder CD of the selected plane PB. The transfer of the write data DAT is performed every 16 bits. The multiplexer MUX transfers the read data DAT transferred from the column decoder CD of the selected plane PB to the input/output circuit 12. The transfer of the read data DAT is performed, for example, every 16 bits.

The schematic configuration for data transfer between the input/output circuit 12 and the planes PB is described above. Data transfer in the selected plane PB is as described with reference to FIG. 3.

The above description of the data transfer also applies to transfer of compressed data to be described later. The same applies to the following description of data transfer.

A configuration for the data transfer in the plane PB will be described in more detail.

(7) Divisions

Figure 7:
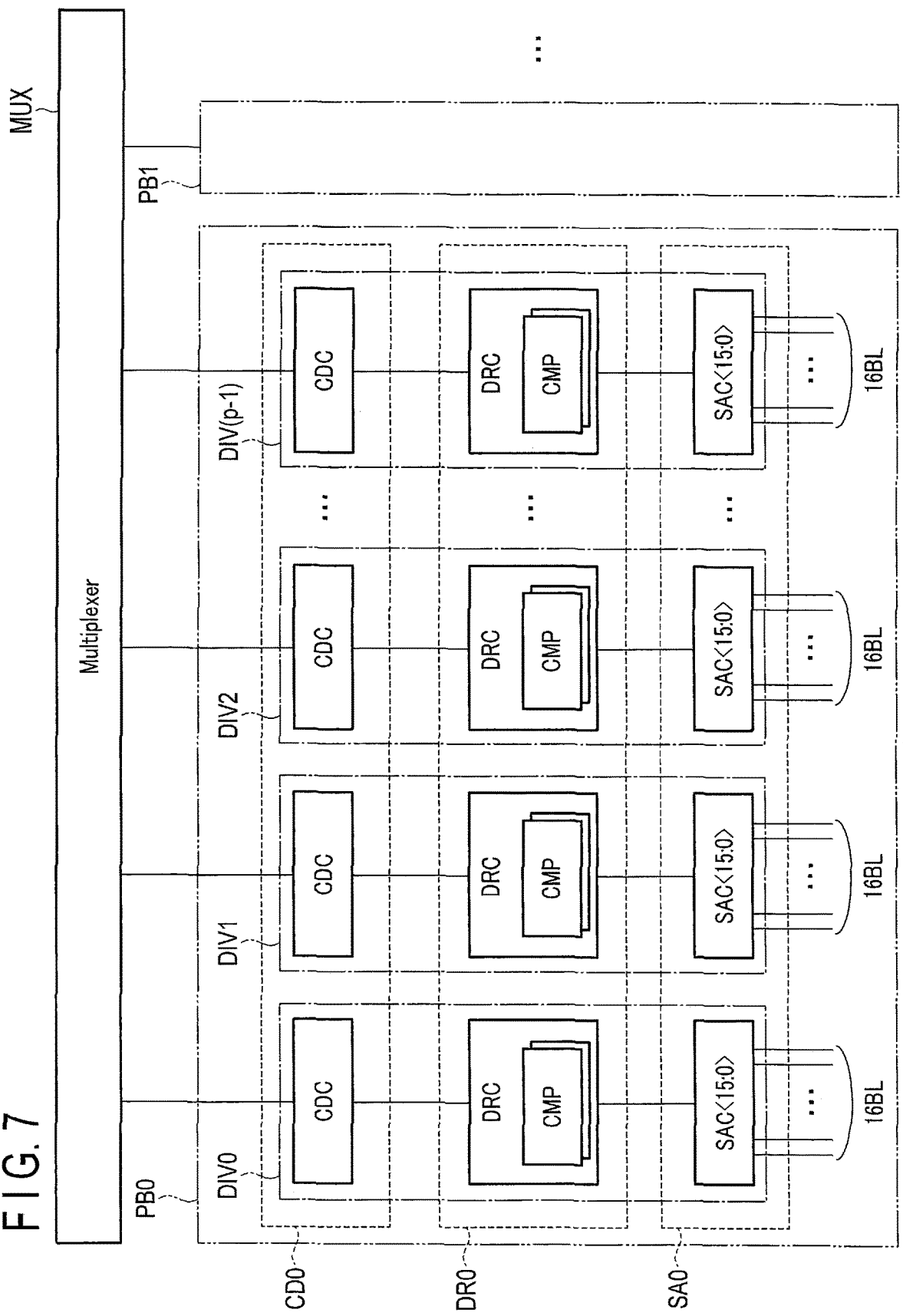
FIG. 7 is a diagram for describing in detail a configuration of each of the planes of the semiconductor memory device according to the first embodiment.

FIG. 7 is a diagram for describing in detail a configuration of each of the planes PB of the semiconductor memory device 1 according to the first embodiment.

Although the configuration of the plane PB0 will be described below, each of the other planes PB has a configuration similar to that described for the plane PB0, for example.

The plane PB0 includes divisions DIV0, DIV1, DIV2, ..., and DIV(p−1) (p is a natural number). Each of the divisions DIV is provided for every 16 bit lines BL, for example. In the present specification, a case where each division DIV is provided for every 16 bit lines BL will be described. The number of divisions DIV included in each plane PB may vary from plane PB to plane PB.

Although the configuration of the division DIV0 will be described below, each of the other divisions DIV may have a configuration similar to that described for the division DIV0.

The division DIV0 includes a column decoder circuit CDC, a data register circuit DRC, and, for example, 16 sense amplifier circuits SAC<15:0>. The division DIV0 is associated with 16 bit lines BL, for example.

The column decoder circuit CDC is a control unit of transfer of data DAT between the column decoder CD0 and the input/output circuit 12. The column decoder circuit CDC is coupled to the multiplexer MUX. A combination of the column decoder circuits CDC of all the divisions DIV of the plane PB0 constitutes the column decoder CD0.

The data register circuit DRC is coupled to the column decoder circuit CDC. A combination of the data register circuits DRC of all the divisions DIV of the plane PB0 constitutes the data register DR0.

The data register circuit. DRC includes, for example, 16 data latch circuits that are associated with the 16 bit lines BL on a one-to-one basis and function as a cache memory. Each of the 16 data latch circuits is coupled in series between the bit line BL associated with the data latch circuit and the input/output circuit 12. In the write operation, the data register circuit DRC holds data of each bit of data transferred from the column decoder circuit CDC in of the 16 data latch circuits. In the read operation, the data register circuit DRC generates data based on data transferred from the 16 sense amplifier circuits SAC<15:0> coupled to the data register circuit DRC, and holds data of each bit of the generated data in any of the 16 data latch circuits.

The data register circuit DRC includes, for example, two compression circuits CMP.

Each of the 16 sense amplifier circuits SAC<15:0> is coupled to the data register circuit DRC. The 16 sense amplifier circuits SAC<15:0> are associated with the 16 bit lines BL on a one-to-one basis. Each of the 16 sense amplifier circuits SAC<15:0> is coupled to the bit line BL associated with the sense amplifier circuit SAC. A set of the sense amplifier circuits SAC included in all the divisions DIV of the plane PB0 constitutes the sense amplifier module SA0.

In the write operation, each of the 16 sense amplifier circuits SAC<15:0> controls a voltage to be applied to the bit line BL associated with the sense amplifier circuit SAC. In the read operation, each of the 16 sense amplifier circuits SAC<15:0> senses a change in a current flowing through the bit line BL associated with the sense amplifier circuit SAC or a change in the potential of the bit line BL, and transfers data based on the sensing to the data register circuit DRC.

Data transfer from the division DIV0 to the multiplexer MUX will be described below.

Figure 8:
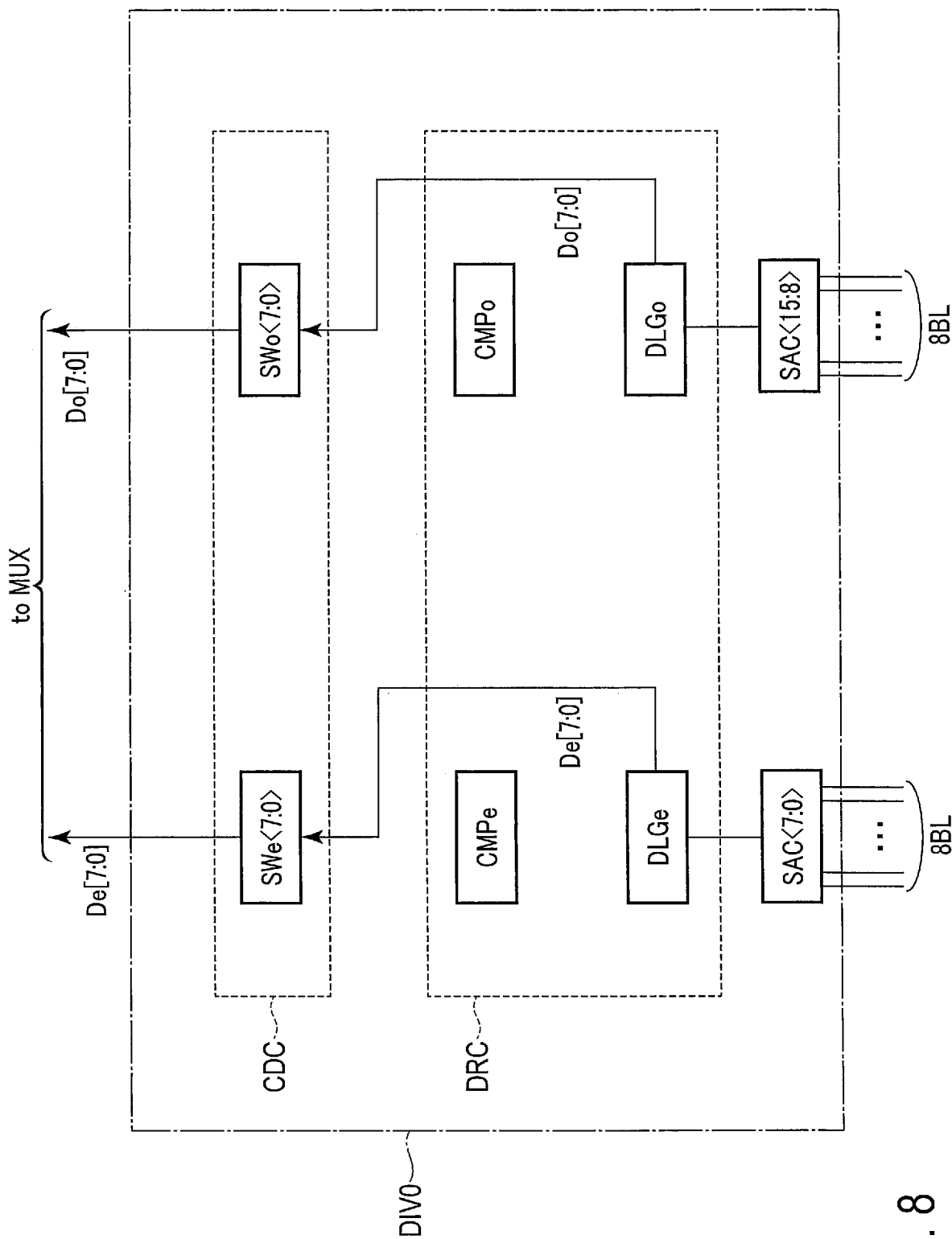
FIG. 8 is a diagram for describing an example of data transfer via a certain division of a certain plane of the semiconductor memory device according to the first embodiment.

FIG. 8 is a diagram for describing an example of data transfer via the division DIV0 of the plane PB0 of the semiconductor memory device 1 according to the first embodiment.

The data register circuit DRC includes a data latch group DLGe and a data latch group DLGo. The data latch group DLGe is coupled to the sense amplifier circuits SAC<7:0>. The data latch group DLGo is coupled to the sense amplifier circuits SAC<15:8>. Further, the two compression circuits CMP illustrated in FIG. 7 are illustrated as compression circuits CMPe and CMPo in FIG. 8. The compression circuit CMPe is associated with the data latch group DLGe. The compression circuit CMPo is associated with the data latch group DLGo.

The column decoder circuit CDC includes switches SWe<7:0> and switches SWo<7:0>. The switches SWe<7:0> are switches for transferring 8-bit data, and are, for example, a set of switches prepared for each bit. The same applies to other switches with similar notation. The switches SWe<7:0> are associated with the data latch group DLGe. The switches SWo<7:0> are associated with the data latch group DLGo.

Each of the eight sense amplifier circuits SAC<7:0> senses a signal relating to a threshold voltage of a certain memory cell transistor MT electrically coupled via the bit line BL associated with the sense amplifier circuit SAC, and transfers data based on the sensing to the data latch group DLGe.

The data register circuit DRC generates, for each of the sense amplifier circuits SAC<7:0>, data relating to the threshold voltage of the memory cell transistor MT electrically coupled to the sense amplifier circuit SAC based on the data transferred to the data latch group DLGe. As a result, the data register circuit DRC generates data De[7:0] relating to the threshold voltages of eight memory cell transistors MT electrically coupled to the sense amplifier circuits SAC<7:0>, respectively. The data De[7:0] is 8-bit data. The data De[7:0] is, for example, a part of hard bit data to be described later or a part of soft bit data to be described later. The data register circuit DRC causes the data latch group DLGe to hold the data De[7:0].

For example, the data latch group DLGe transfers the data De[7:0] to the switches SWe<7:0>. The switches SWe<7:0> can transfer the data De[7:0] to the multiplexer MUX.

Each of the eight sense amplifier circuits SAC<15:8> senses a signal relating to a threshold voltage of a certain memory cell transistor MT electrically coupled via the bit line BL associated with the sense amplifier circuit SAC, and transfers data based on the sensing to the data latch group DLGo.

The data register circuit DRC generates, for each of the sense amplifier circuits SAC<15:8>, data relating to the threshold voltage of the memory cell transistor MT electrically coupled to the sense amplifier circuit SAC based on the data transferred to the data latch group DLGo. As a result, the data register circuit DRC generates data Do[7:0] relating to the threshold voltages of eight memory cell transistors MT electrically coupled to the sense amplifier circuits SAC<15:8>, respectively. The data Do[7:0] is 8-bit data. The data Do[7:0] is, for example, a part of the hard bit data to be described later or a part of the soft bit data to be described later. The data register circuit DRC causes the data latch group DLGo to hold the data Do[7:0].

For example, the data latch group DLGo transfers the data Do[7:0] to the switches SWo<7:0>. The switches SWo<7:0> can transfer the data Do[7:0] to the multiplexer MUX.

In this way, the column decoder circuit CDC transfers the data De[7:0] and the data Do[7:0] to the multiplexer MUX. 16 bits, which is a unit of the transfer of the read data DAT from the column decoder CD0 to the multiplexer MUX described with reference to FIG. 6, corresponds to, for example, the data De[7:0] and the data Do[7:0] transferred from the column decoder circuit CDC.

Figure 9:
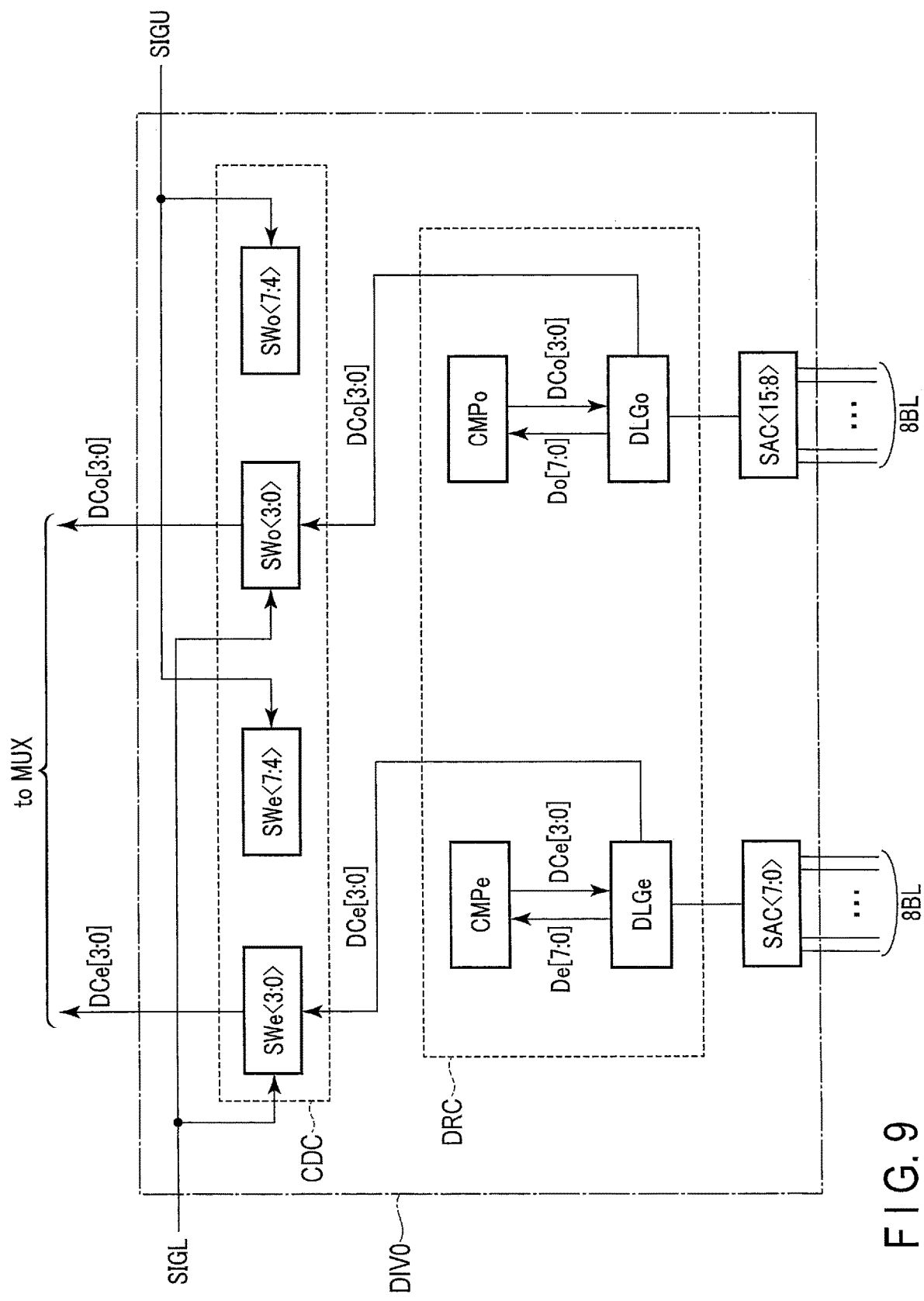
FIG. 9 is a diagram for describing another example of data transfer via the division of the semiconductor memory device according to the first embodiment.

FIG. 9 is a diagram for describing another example of data transfer via the division DIV0 of the semiconductor memory device 1 according to the first embodiment.

In FIG. 9, the switches SWe<7:0> illustrated in FIG. 8 are illustrated separately as the switches SWe<3:0> and the switches SWe<7:4>, and the switches SWo<7:0> illustrated in FIG. 8 are illustrated separately as the switches SWo<3:0> and the switches SWo<7:4>.

The switches SWe<3:0> are switches for transferring data of lower 4 bits of 8-bit data transferred to the switches SWe<7:0>. The switches SWe<7:4> are switches for transferring data of upper 4 bits of the 8-bit data transferred to the switches SWe<7:0>. The same applies to the relationship between the switches SWo<3:0> and the switches SWo<7:4>.

The generation and holding of the data De[7:0] and the data Do[7:0] by the data register circuit DRC are the same as those described with reference to FIG. 8. In this case, the data De[7:0] and the data Do[7:0] are, for example, a part of the soft bit data.

The compression circuit CMPe generates compressed data DCe[3:0] based on the data De[7:0] held in the data latch group DLGe. For example, the compressed data DCe[3:0] is held in the data latch group DLGe under control by the sequencer 15. The compressed data DCe[3:0] is 4-bit data. Details of the generation of the compressed data DCe[3:0] will be described later. For example, the memory controller 2 can generate the data De[7:0] before the compression based on the compressed data DCe[3:0].

The data latch group DLGe transfers the compressed data DCe[3:0] to the switches SWe<3:0>.

The switches SWe<3:0> can transfer the compressed data DCe[3:0] to the multiplexer MUX. For example, a control signal SIGL is supplied to the switches SWe<3:0> by the sequencer 15. The transfer of the compressed data DCe[3:0] to the multiplexer MUX via the switches SWe<3:0> is controlled by the control signal SIGL.

The compression circuit CMPo generates compressed data DCo[3:0] based on the data Do[7:0] held in the data latch group DLGo. For example, the compressed data DCo[3:0] is held in the data latch group DLGo under control by the sequencer 15. The compressed data DCo[3:0] is 4-bit data. Details of the generation of the compressed data DCo[3:0] will be described later. For example, the memory controller 2 can generate the data Do[7:0] before the compression based on the compressed data DCo[3:0].

For example, the data latch group DLGo transfers the compressed data DCo[3:0] to the switches SWo<3:0>.

The switches SWo<3:0> can transfer the compressed data DCo[3:0] to the multiplexer MUX. For example, the control signal SIGL is also supplied to the switches SWo<3:0> by the sequencer 15. The transfer of the compressed data DCo[3:0] to the multiplexer MUX via the switches SWo<3:0> is controlled by the control signal SIGL.

In this way, the column decoder circuit CDC transfers the compressed data DCe[3:0] and the compressed data DCo[3:0] to the multiplexer MUX. In this case, the sum of the number of bits of the compressed data DCe[3:0] transferred from the column decoder circuit CDC to the multiplexer MUX and the number of bits of the compressed data DCo[3:0] transferred from the column decoder circuit CDC to the multiplexer MUX is 8 bits, which is half of 16 bits of the sum of the number of bits of the data De[7:0] and the number of bits of the data Do[7:0] in the example of FIG. 8.

Although the example in which the compressed data is transferred to the switches SWe<3:0> and the switches SWo<3:0> has been described above, the compressed data may be transferred to the switches SWe<7:4> and the switches SWo<7:4> instead of the switches SWe<3:0> and the switches SWo<3:0>. Hereinafter, when the compressed data is transferred to the switches SWe<7:4>, the compressed data is referred to as compressed data DCe[7:4], and when the compressed data is transferred to the switches SWo<7:4>, the compressed data is referred to as compressed data DCo[7:4]. Each of the compressed data DCe[7:4] and the compressed data DCo[7:4] is 4-bit data.

For example, a control signal SIGU is supplied to the switches SWe<7:4> by the sequencer 15. The control signal SIGU is different from the control signal SIGL, for example. The transfer of the data to the multiplexer MUX via the switches SWe<7:4> is controlled by the control signal SIGU. For example, the control signal SIGU is also supplied to the switches SWo<7:4> by the sequencer 15. The transfer of the data to the multiplexer MUX via the switches SWo<7:4> is controlled by the control signal SIGU.

FIG. 10 illustrates an example of a configuration for data transfer from the division DIV0 to the input/output circuit 12 in the semiconductor memory device 1 according to the first embodiment.

The multiplexer MUX includes an interconnect group ICGL and an interconnect group ICGU as data buses. The multiplexer MUX is coupled to the input/output circuit 12 via, for example, a data bus DBL associated with the interconnect group ICGL and a data bus DBU associated with the interconnect group ICGU.

The interconnect group ICGL is a transmission path of data transferred from each division DIV via the switches SWe<3:0> and the switches SWo<3:0>. The interconnect group ICGU is a transmission path of data transferred from each division DIV via the switches SWe<7:4> and the switches SWo<7:4>.

The data bus DBL is a transfer path of data transmitted via the interconnect group ICGL from the multiplexer MUX to the input/output circuit 12. The data bus DBU is a transfer path of data transmitted via the interconnect group ICGU from the multiplexer MUX to the input/output circuit 12.

The compressed data DCe[3:0] transferred from the division DIV0 via the switches SWe<3:0> and the compressed data DCo[3:0] transferred from the division DIV0 via the switches SWo<3:0> described with reference to FIG. 9 are transmitted via the interconnect group ICGL in the multiplexer MUX.

The compressed data DCe[3:0] and the compressed data DCo[3:0] transmitted via the interconnect group ICGL are transferred from the multiplexer MUX to the input/output circuit 12 via the data bus DBL.

The input/output circuit 12 transmits the transferred compressed data DCe[3:0] and the transferred compressed data DCo[3:0] to the memory controller 2 via the signals DQ<3:0>. The transmission of the compressed data DCe[3:0] and the compressed data DCo[3:0] via the signals DQ<3:0> of 8-bit data in total is performed in a single cycle of the toggled signals DQS and bDQS.

The case where the compressed data is transferred to the multiplexer MUX via the switches SWe<3:0> and the switches SWo<3:0> has been described above. The case where the compressed data is transferred to the multiplexer MUX via the switches SWe<7:4> and the switches SWo<7:4> instead of the switches SWe<3:0> and the switches SWo<3:0> is as follows. The compressed data is transmitted via the interconnect group ICGU instead of the interconnect group ICGL and then transferred to the input/output circuit 12 via the data bus DBU instead of the data bus DBL. The compressed data is transmitted from the input/output circuit 12 to the memory controller 2 via the signals DQ<7:4>.

In addition, as described with reference to FIG. 8, the case where the uncompressed data De[7:0] and Do[7:0] is transferred to the multiplexer MUX via the switches SWe<7:0> and the switches SWo<7:0> is as follows.

The lower 4-bit data of the data De[7:0] and the lower 4-bit data of the data Do[7:0] are transferred to the input/output circuit 12 via the interconnect group ICGL and the data bus DBL, and then transmitted from the input/output circuit 12 to the memory controller 2 via the signals DQ<3:0>. The upper 4-bit data of the data De[7:0] and the upper 4-bit data of the data Do[7:0] are transferred to the input/output circuit 12 via the interconnect group ICGU and the data bus DBU, and then transmitted from the input/output circuit 12 to the memory controller 2 via the signals DQ<7:4>.

(8) Data Latch Groups

Figure 11:
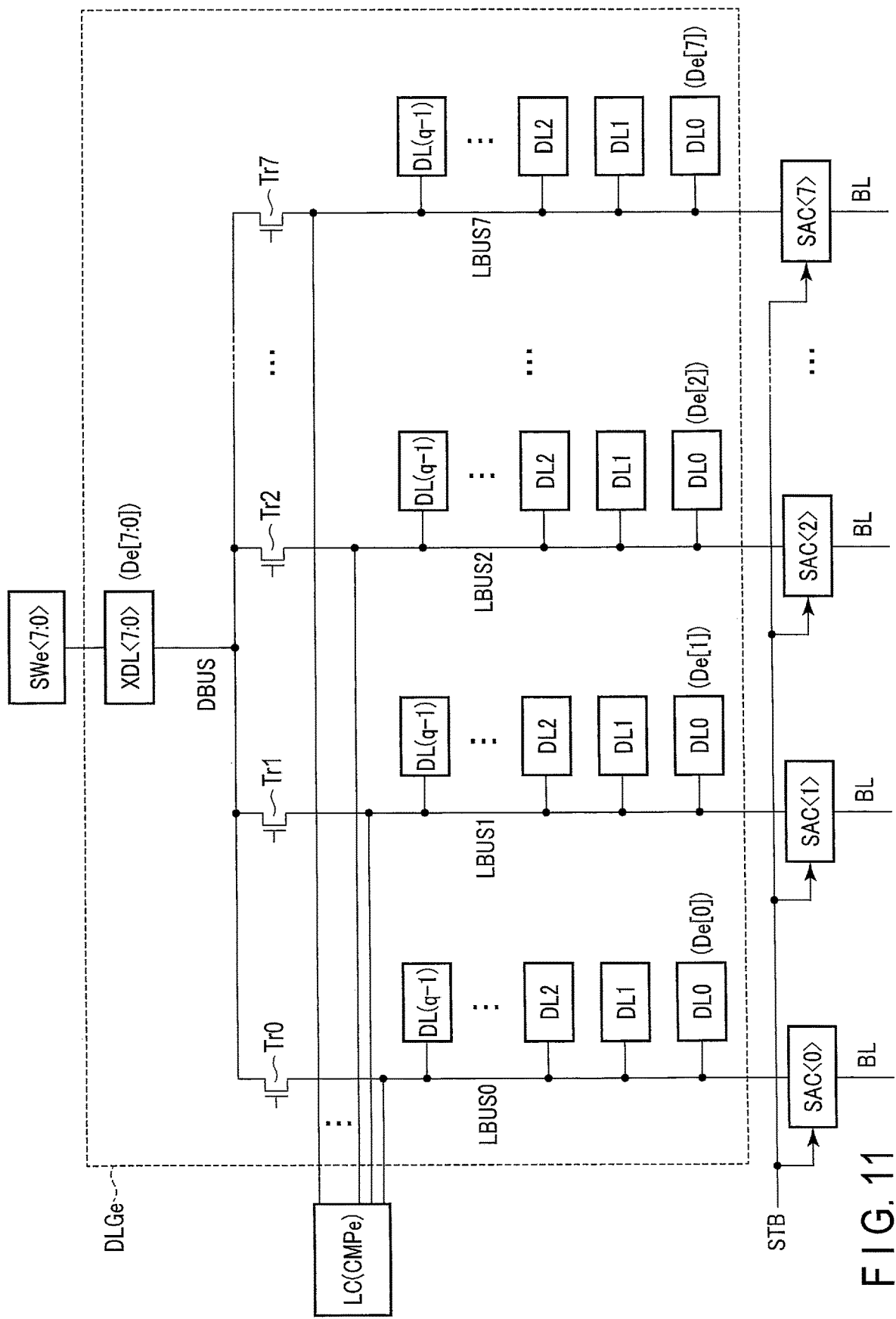
FIG. 11 illustrates an example of a configuration of a data latch group of a data register circuit of the division of the semiconductor memory device according to the first embodiment.

FIG. 11 illustrates an example of a configuration of the data latch group DLGe of the data register circuit DRC of the division DIV0 of the semiconductor memory device 1 according to the first embodiment. The data latch group DLGo of the data register circuit DRC may also have a configuration similar to that described below. The configuration of the data latch group DLGe described below is merely an example, and various configurations can be applied as the data latch group DLGe.

The data latch group DLGe includes data latch circuits DL0, DL1, DL2, . . . , and DL(q−1) (q is a natural number) coupled to the sense amplifier circuit SAC<0> via a bus LBUS0. The data latch group DLGe further includes data latch circuits DL0, DL1, DL2, . . . , and DL(q−1) coupled to the sense amplifier circuit SAC<1> via a bus LBUS1. The data latch group DLGe further includes data latch circuits DL0, DL1, DL2, . . . , and DL(q−1) coupled to the sense amplifier circuit SAC<2> via a bus LBUS2. The same applies to the other sense amplifier circuits SAC. The data latch group DLGe further includes data latch circuits DL0, DL1, DL2, . . . , and DL(q−1) coupled to the sense amplifier circuit SAC<7> via a bus LBUS7. Each data latch circuit DL is associated with a sense amplifier circuit SAC coupled to the data latch circuit DL via a bus LBUS, receives data via the bus LBUS, and temporarily holds the received data, for example. Each data latch circuit DL can hold, for example, 1-bit data. The number of data latch circuits DL coupled to each bus LBUS is based on, for example, the number of bits of data stored in each memory cell transistor MT.

The data latch group DLGe further includes transistors Tr0, Tr1, Tr2, . . . , and Tr7 and eight data latch circuits XDL<7:0>. Each of these transistors is, for example, a field effect transistor (FET) such as an n-channel metal oxide semiconductor (MOS) transistor. The same applies to components referred to herein as transistors, unless otherwise noted. Each data latch circuit XDL can hold, for example, 1-bit data.

A first end of the transistor Tr0 is coupled to the bus LBUS0, and a second end of the transistor Tr0 is coupled to a bus DBUS. A first end of the transistor Tr1 is coupled to the bus LBUS1, and a second end of the transistor Tr1 is coupled to the bus DBUS. A first end of the transistor Tr2 is coupled to the bus LBUS2, and a second end of the transistor Tr2 is coupled to the bus DBUS. The same applies to the other transistors Tr. A first end of the transistor Tr7 is coupled to the bus LBUS7, and a second end of the transistor Tr7 is coupled to the bus DBUS. A certain control signal is input to the gate of each transistor Tr. The control signal is supplied from, for example, the sequencer 15.

The eight data latch circuits XDL<7:0> are eight of the 16 data latch circuits functioning as the cache memory described with reference to FIG. 7. Each of the eight data latch circuits XDL<7:0> is coupled to the bus DBUS. The eight data latch circuits XDL<7:0> are coupled to the switches SWe<7:0>.

An arithmetic circuit LC is coupled to the buses LBUS0, LBUS1, LBUS2, . . . , and LBUS7. The arithmetic circuit LC can perform a logical operation on data in the various data latch circuits DL and XDL. The logical operation includes a negative (NOT) operation, a logical sum (OR) operation, a logical product (AND) operation, an exclusive logical sum (XOR) operation, a negative exclusive logical sum (XNOR) operation, and the like. As described later, the arithmetic circuit LC can function as the compression circuit CMPe.

The data transfer described with reference to FIG. 8 will be described in more detail based on the configuration of the data latch group DLGe.

In the read operation, a control signal STB is supplied to each sense amplifier circuit SAC by, for example, the sequencer 15.

For example, in the read operation, the sense amplifier circuit SAC<0> senses a signal relating to the threshold voltage of the memory cell transistor MT electrically coupled via the bit line BL associated with the sense amplifier circuit SAC<0>. More specifically, the sense amplifier circuit SAC<0> senses, for example, change in a current flowing through the bit line BL or a change in the potential of the bit line BL. The sense amplifier circuit SAC<0> determines data based on the sensing when the control signal STB is asserted, and outputs the data to the bus LBUS0. For example, the data is transferred to and held in a certain data latch circuit DL coupled to the bus LBUS0 based on control by the sequencer 15.

The arithmetic circuit LC generates 1-bit data De[0] relating to the threshold voltage of the memory cell transistor MT based on the data held in the data latch circuit DL in this manner. For example, the data De[0] is transferred to and held in a certain data latch circuit DL (for example, the data latch circuit DL0) coupled to the bus LBUS0 based on control by the sequencer 15.

Similarly, 1-bit data De[1] relating to the threshold voltage of the memory cell transistor MT electrically coupled to the sense amplifier circuit SAC<1> is held in a certain data latch circuit (for example, the data latch circuit DL0) coupled to the bus LBUS1. Similarly, 1-bit data De[2] relating to the threshold voltage of the memory cell transistor MT electrically coupled to the sense amplifier circuit SAC<2> is held in a certain data latch circuit (for example, the data latch circuit DL0) coupled to the bus LBUS2. Similarly, 1-bit data De[7] relating to the threshold voltage of the memory cell transistor MT electrically coupled to the sense amplifier circuit SAC<7> is held in a certain data latch circuit (for example, the data latch circuit DL0) coupled to the bus LBUS7.

A set of the data De[0], the data De [1], the data De[2], . . . , and the data De [7] generated and held in this manner corresponds to the data De[7:0] described with reference to FIG. 8.

The data De[0], the data De[1], the data De[2], . . . , and the data De[7] held in this manner are sequentially transferred to and held in the eight data latch circuits XDL<7:0> via the bus DBUS under, for example, control of the transistors Tr0, Tr1, Tr2, . . . , and Tr7 by the sequencer 15. The data De[7:0] held in the data latch circuits XDL<7:0> is transferred from the data latch group DLGe to the switches SWe<7:0> as described with reference to FIG. 8.

Next, the data transfer described with reference to FIG. 9 will be described in more detail based on the configuration of the data latch group DLGe.

For the purpose of facilitating the description, FIG. 12 illustrates a configuration of the data latch group DLGe illustrated in FIG. 11. In FIG. 12, the eight data latch circuits XDL<7:0> illustrated in FIG. 11 are classified into the four data latch circuits XDL<3:0> and the four data latch circuits XDL<7:4>.

The arithmetic circuit LC generates the compressed data DCe[3:0] described with reference to FIG. 9 based on the data De[0], the data De[1], the data De[2], . . . , and the data De[7] held in the various data latch circuits (for example, the data latch circuit DL0, the data latch circuit XDL, and the like). The compressed data DCe[3:0] is transferred to and held in the four data latch circuits XDL<3:0> via the bus DBUS under, for example, control of the transistors Tr0, Tr1, Tr2, . . . , and Tr7 by the sequencer 15. The compressed data DCe[3:0] held in the data latch circuits XDL<3:0> is transferred from the data latch group DLGe to the switches SWe<3:0> as described with reference to FIG. 9.

(9) Soft Bit Data

An example of the soft bit data is described below. The soft bit data to which the technology disclosed in this specification is applicable is not limited to that exemplified below.

The hard bit data is, for example, data of a lower page, data of a middle page, or data of an upper page read from memory cell transistors MT of a cell unit CU to be read.

The soft bit data is, for example, data relating to the threshold voltage of each of the memory cell transistors MT of the cell unit CU. The soft bit data can be used, for example, for calculating the likelihood of data of each bit of the hard bit data, and can be used for error correction processing by the error check and correction circuit 26 of the memory controller 2.

The read data DAT referred to herein may include both hard bit data and soft bit data.

The soft bit data read from the memory cell transistors MT of the cell unit CU will be described below.

Figure 13:
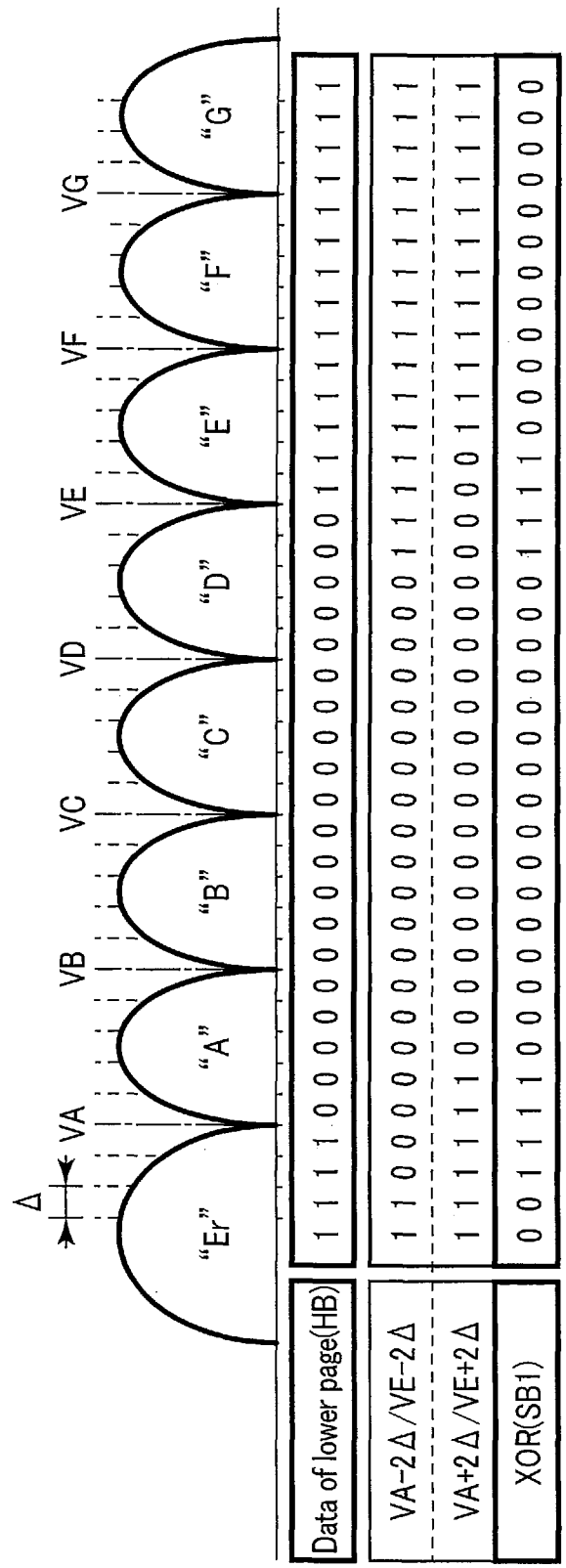
FIG. 13 is a diagram for describing an example of soft bit data.

FIG. 13 is a diagram for describing an example of the soft bit data. FIG. 13 illustrates an example of data of each bit of hard bit data HB and data of each bit of soft bit data SB1 relating to the hard bit data HB in a case where the hard bit data HB is the data of the lower page.

The data of each bit of the hard bit data HB is as follows. As illustrated in the first row, data of a bit relating to a memory cell transistor MT having a threshold voltage less than the voltage VA or equal to or greater than the voltage VE is "1" data, and data of a bit relating to a memory cell transistor MT having a threshold voltage equal to or greater than the voltage VA and less than the voltage VE is "0" data.

In order to acquire the soft bit data SB1, first, as the reading of the data of the lower page, reading using a voltage (voltage VA−2Δ) lower than the voltage VA by a certain magnitude and a voltage (voltage VE−2Δ) lower than the voltage VE by the certain magnitude is performed instead of each of the voltage VA and the voltage VE.

Data of each bit of the data read in this manner is as follows. As illustrated in the second row, data of a bit relating to a memory cell transistor MT having a threshold voltage less than the voltage VA−1Δ or equal to or greater than the voltage VE−2Δ is "1" data, and data of a bit relating to a memory cell transistor MT having a threshold voltage equal to or greater than the voltage VA−1Δ and less than the voltage VE−2Δ is "0" data. Data of each bit is held in a certain data latch circuit (for example, the data latch circuit DL0) coupled to a memory cell transistor MT relating to the bit via the bus LBUS.

Similarly, as the reading of the data of the lower page, reading using the voltage VA+2Δ and the voltage VE+2Δ is performed instead of the voltage VA and the voltage VE, respectively.

Data of each bit of the data read in this manner is as follows. As illustrated in the third row, data of a bit relating to a memory cell transistor MT having a threshold voltage less than the voltage VA+2Δ or equal to or greater than the voltage VE+2Δ is "1" data, and data of a bit relating to a memory cell transistor MT having a threshold voltage equal to or greater than the voltage VA+2Δ and less than the voltage VE+2Δ is "0" data. Data of each bit is held in a certain data latch circuit (for example, the data latch circuit DL1) coupled to a memory cell transistor MT relating to the bit via the bus LBUS.

Subsequently, for each memory cell transistor MT of the cell unit CU, the arithmetic circuit LC coupled to the memory cell transistor MT via the bus LBUS performs an XOR operation on the data in the data latch circuit DL0 coupled to the bus LBUS and the data in the data latch circuit DL1 coupled to the bus LBUS. For example, the result of the operation is held in a certain data latch circuit DL (for example, the data latch circuit XDL) coupled to the bus LBUS.

Thus, the data held in the data latch circuit XDL relating to each of the memory cell transistors MT of the cell unit CU is the soft bit data SB1.

Among the bits of the soft bit data SB1, bits of "1" data are present only at a very low ratio, for example, 1% or less.

(10) Compressed Data

Figure 14:
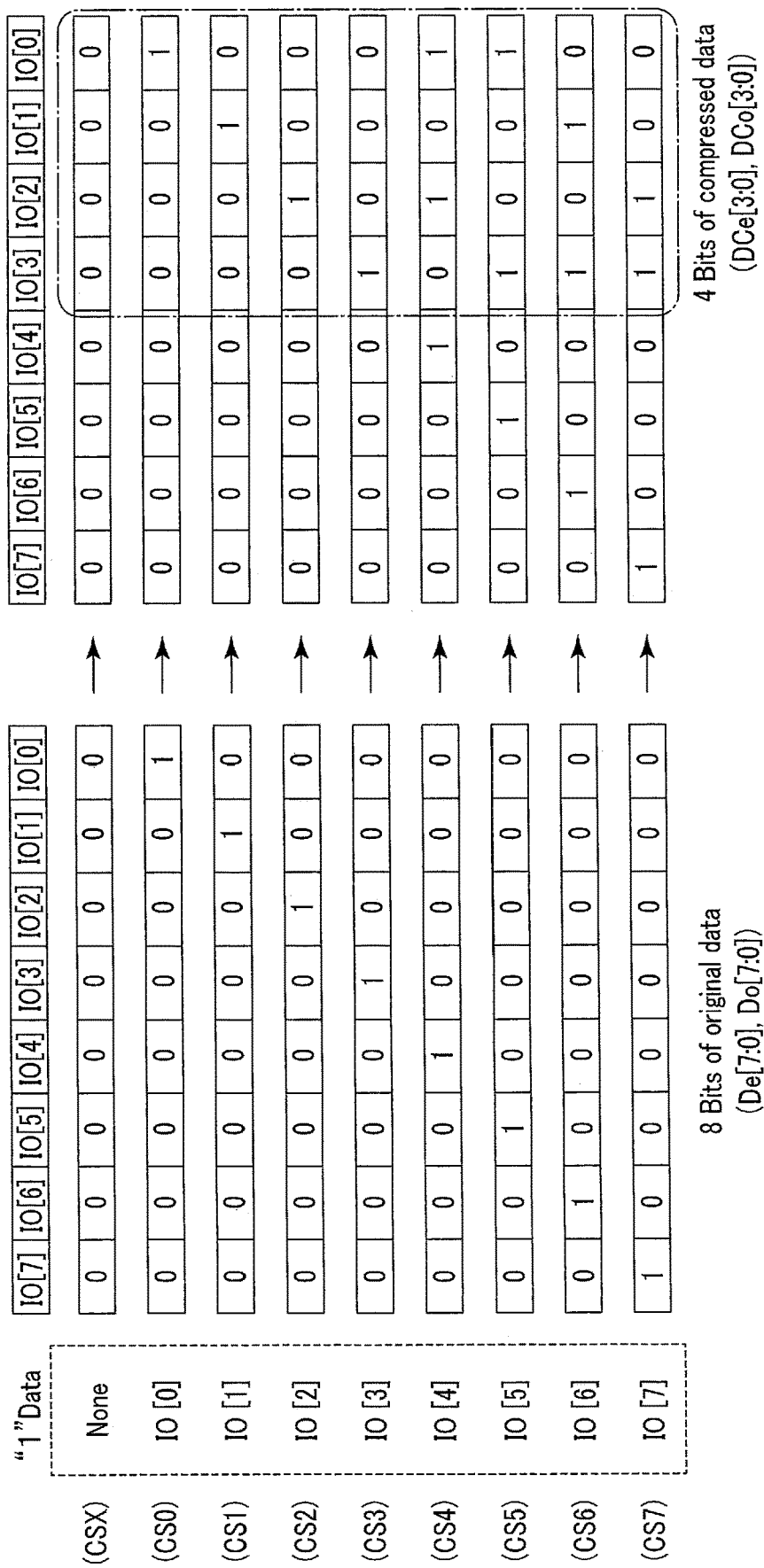
FIG. 14 is a diagram for describing compressed data generated by a compression circuit of the semiconductor memory device according to the first embodiment.

FIG. 14 is a diagram for describing compressed data generated by a compression circuit CMP of the semiconductor memory device 1 according to the first embodiment. Each of the other compression circuits CMP included in the semiconductor memory device 1 can also generate compressed data in the same manner as described below.

The compression of the data De[7:0] into the compressed data DCe[3:0] by the compression circuit CMPe and the compression of the data Do[7:0] into the compressed data DCo[3:0] by the compression circuit CMPo described with reference to FIGS. 9 and 12 are executed similarly to the compression of 8-bit data IO[7:0] described below. The compression of other data referred to herein may be performed in the same manner as described below. Note that the generation of compressed data described below is merely an example, and the compressed data may be generated by another method.

In the following description, the eight bits of the data IO[7:0] are also referred to as a 0th bit, a 1st bit, a 2nd bit, a 3rd bit, a 4th bit, a 5th bit, a 6th bit, and a 7th bit in order from the lowest bit. Hereinafter, when data of a certain bit is "0" data, the bit value of the certain bit is also referred to as 0, and when data of a certain bit is "1" data, the bit value of the certain bit is also referred to as 1.

FIG. 14 illustrates the compression of the data IO[7:0] in 9 cases where the number of bits of "1" data among the 0th to 7th bits is 1 or less. As described with reference to FIG. 13, this is due to the fact that the bits of "1" data among the bits of the soft bit data SB1 are present only at a very low ratio, for example, 1% or less. The compression illustrated in FIG. 14 is implemented, for example, based on the conversion of the data IO[7:0] illustrated in FIG. 15.

Each conversion step illustrated in FIG. 15 will be described.

Each compression circuit CMP executes the following processing based on a certain control signal supplied from the sequencer 15, for example. The control signal may be based on a certain command transmitted from the memory controller 2 to the semiconductor memory device 1.

First, the compression circuit CMP converts the data IO[7:0] such that the value of the result of executing the OR operation on the bit values of the 2nd bit and the 4th bit becomes the bit value of the 2nd bit (ST01).

Subsequently, the compression circuit CMP converts the data IO[7:0] such that the value of the result of executing the OR operation on the bit values of the 3rd bit and the 5th bit becomes the bit value of the 3rd bit (ST02).

Subsequently, the compression circuit CMP converts the data IO[7:0] such that the value of the result of executing the OR operation on the bit values of the 3rd bit and the 6th bit becomes the bit value of the 3rd bit (ST03).

Subsequently, the compression circuit CMP converts the data IO[7:0] such that the value of the result of executing the OR operation on the bit values of the 3rd bit and the 7th bit becomes the bit value of the 3rd bit (ST04).

Subsequently, the compression circuit CMP converts the data IO[7:0] such that the value of the result of executing the OR operation on the bit values of the 0th bit and the 4th bit becomes the bit value of the 0th bit (ST05).

Subsequently, the compression circuit CMP converts the data IO[7:0] such that the value of the result of executing the OR operation on the bit values of the 0th bit and the 5th bit becomes the bit value of the 0th bit (ST06).

Subsequently, the compression circuit CMP converts the data IO[7:0] such that the value of the result of executing the OR operation on the bit values of the 1st bit and the 6th bit becomes the bit value of the 1st bit (ST07).

Subsequently, the compression circuit CMP converts the data IO[7:0] such that the value of the result of executing the OR operation on the bit values of the 2nd bit and the 7th bit becomes the bit value of the 2nd bit (ST08).

Subsequently, the compression circuit CMP sets the data of the 0th bit, the 1st bit, the 2nd bit, and the 3rd bit in the data IO [7:0] after the conversion performed in this way as compressed data of the data IO [7:0] (hereinafter also referred to as original data IO[7:0]) before the conversion of ST01.

Next, compressed data generated based on the conversion described with reference to FIG. 15 from the original data IO[7:0] of the 9 cases illustrated in FIG. 14 will be described.

In a case (case CSX) where a bit of "1" data is not present in the 8 bits of the original data IO[7:0], data of each of the 4 bits of the compressed data is "0" data.

In a case (case CS0) where only the data (data IO[0]) of the 0th bit among the 8 bits of the original data IO[7:0] is "1" data, the compressed data is as follows. In the compressed data, the data of the 1st bit, the 2nd bit, and the 3rd bit is "0" data, and the data of the 0th bit is "1" data.

In a case (case CS1) where only the data (data IO[1]) of the 1st bit among the 8 bits of the original data IO[7:0] is "1" data, the compressed data is as follows. In the compressed data, the data of the 0th bit, the 2nd bit, and the 3rd bit is "0" data, and the data of the 1st bit is "1" data.

In a case (case CS2) where only the data (data IO[2]) of the 2nd bit among the 8 bits of the original data IO[7:0] is "1" data, the compressed data is as follows. In the compressed data, the data of the 0th bit, the 1st bit, and the 3rd bit is "0" data, and the data of the 2nd bit is "1" data.

In a case (case CS3) where only the data (data IO[3]) of the 3rd bit among the 8 bits of the original data IO[7:0] is "1" data, the compressed data is as follows. In the compressed data, the data of the 0th bit, the 1st bit, and the 2nd bit is "0" data, and the data of the 3rd bit is "1" data.

In a case (case CS4) where only the data (data IO[4]) of the 4th bit among the 8 bits of the original data IO[7:0] is "1" data, the compressed data is as follows. In the compressed data, the data of the 1st bit and the 3rd bit is "0" data, and the data of the 0th bit and the 2nd bit is "1" data.

In a case (case CS5) where only the data (data IO[5]) of the 5th bit among the 8 bits of the original data IO[7:0] is "1" data, the compressed data is as follows. In the compressed data, the data of the 1st bit and the 2nd bit is "0" data, and the data of the 0th bit and the 3rd bit is "1" data.

In a case (case CS6) where only the data (data IO[6]) of the 6th bit among the 8 bits of the original data IO[7:0] is "1" data, the compressed data is as follows. In the compressed data, the data of the 0th bit and the 2nd bit is "0" data, and the data of the 1st bit and the 3rd bit is "1" data.

In a case (case CS7) where only the data (data IO[7]) of the 7th bit among the 8 bits of the original data IO[7:0] is "1" data, the compressed data is as follows. In the compressed data, the data of the 0th bit and the 1st bit is "0" data, and the data of the 2nd bit and the 3rd bit is "1" data.

As described above, there is no combination of two or more pieces of compressed data that match each other among the compressed data of the 9 cases. Therefore, upon receiving such compressed data, the memory controller 2 can generate the same data as the original data IO[7:0] of the compressed data based on the received compressed data by using, for example, a combination of the CPU 22 and the RAM 23.

Operation Example

An operation example in which the semiconductor memory device 1 according to the first embodiment executes a read operation of reading data from the memory cell arrays MCA of the planes PB, and subsequently executes a data output operation of outputting the read data and causing the memory controller 2 to transmit the data will be described below.

(1) Overall Flow

FIG. 16 is a flowchart illustrating an operation example in which the semiconductor memory device 1 according to the first embodiment executes the read operation and the data output operation.

The memory controller 2 generates, based on a host command from the host device 4, a command set for causing the semiconductor memory device 1 to execute the read operation and transmits the command set to the semiconductor memory device 1. When the semiconductor memory device 1 receives the command set, the operation illustrated in the flowchart of FIG. 16 is started.

The semiconductor memory device 1 reads, for example, soft bit data from the memory cell array MCA to the data register DR for each of two planes PB (hereinafter also referred to as a first plane PB and a second plane PB) in the plane PB based on, for example, the command set (ST11). The soft bit data is held in the plurality of data latch circuits XDL of the data register DR.

The semiconductor memory device 1 generates compressed data of the soft bit data read to the data register DR for each of the first plane PB and the second plane PB (ST12).

The semiconductor memory device 1 transmits the compressed data from the first plane PB and the compressed data from the second plane PB to the memory controller 2 in parallel (ST13).

The operation of ST11, the operation of ST12, and the operation of ST13 described above may be executed in a partially overlapping manner.

(2) Command Sequence

A certain command sequence relating to the flowchart described with reference to FIG. 16 will be described below.

Figure 17:
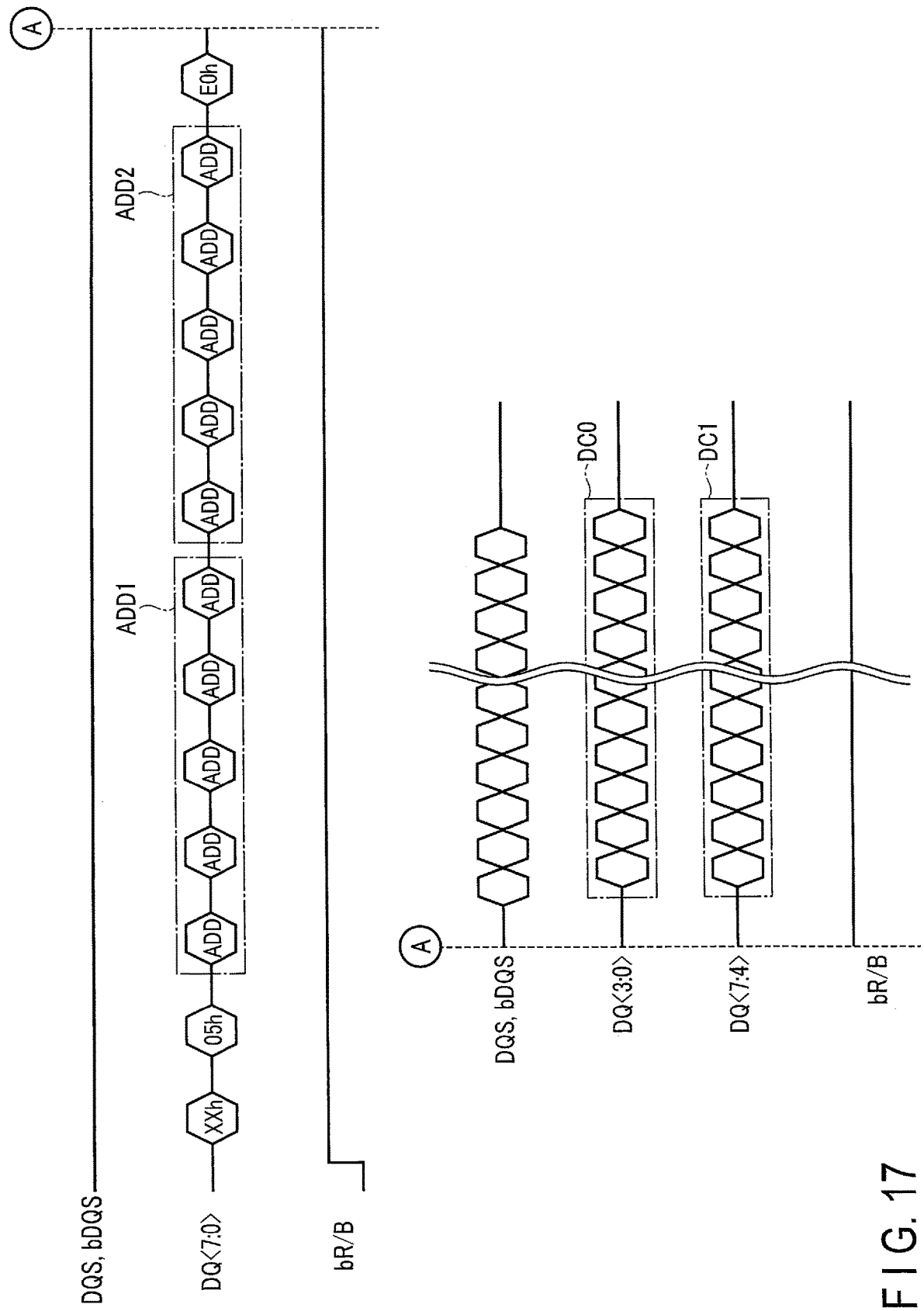
FIG. 17 illustrates an example of a timing chart illustrating a command set relating to a certain data output operation that is executed by the semiconductor memory device according to the first embodiment and changes in other various signals over time.

FIG. 17 illustrates an example of a timing chart illustrating a command set relating to a certain data output operation executed by the semiconductor memory device 1 according to the first, embodiment and changes in other various signals over time. The command set described below is merely an example, and other command sets are also applicable for the data output operation.

For example, when the operation of ST11 illustrated in FIG. 16 is completed, the semiconductor memory device 1 is in the ready state. A case where, for example, soft bit data is read to the data register DR for each of the plane PB0 and the plane PB1 by the operation of ST11 will be described below. More specifically, for each of the planes PB0 and PB1, the data De[7:0] and the data Do[7:0] are held in the data latch group DLGe and the data latch group DLGo of each division DIV of the plane PB, respectively. Note that, in the present specification, data relating to a certain division DIV and data relating to another division DIV may be denoted by the same reference sign, but the contents of the data do not necessarily match even if the data is denoted by the same reference sign.

For example, while the semiconductor memory device 1 uses the H-level ready/busy signal bR/B to notify the memory controller 2 that the semiconductor memory device 1 is in the ready state, the memory controller 2 operates as follows.

The memory controller 2 generates a command set for causing the semiconductor memory device 1 to execute the data output operation and transmits the command set to the semiconductor memory device 1 via the signals DQ<7:0>. The command set includes, for example, a command "XXh", a command "05h", address information ADD1, address information ADD2, and a command "E0h". The semiconductor memory device 1 receives the command set and starts the data output operation. This is specifically as follows.

The memory controller 2 generates the command "XXh" and transmits the command "XXh" to the semiconductor memory device 1. The command "XXh" is, for example, a type of command also referred to as a prefix command, and designates, for example, a method when the semiconductor memory device 1 executes an operation identified by a subsequent command in a command set including the command "XXh". In this case, the command "XXh" is a command used to cause the semiconductor memory device 1 to execute an operation of outputting data read from the plurality of planes PB in parallel and transmitting the data to the memory controller 2 in parallel. The command "XXh" is transferred to the register 14 by the logic controller 13 and the input/output circuit 12.

Subsequently, the memory controller 2 generates the command "05h" and transmits the command "05h" to the semiconductor memory device 1. The command "05h" is, for example, a command used for a data output operation of causing the semiconductor memory device 1 to output the read data transferred to the data latch circuits XDL by the read operation and transmit the read data to the memory controller 2. The command "05h" is transferred to the register 14 by the logic controller 13 and the input/output circuit 12.

Subsequently, the memory controller 2 generates the address information ADD1 over five cycles, for example, and transmits the address information ADD1 to the semiconductor memory device 1. The address information ADD1 includes, for example, a column address and a row address. The row address includes a plane address. The plane address designates a target plane PB. A case where the plane address designates the plane PB0 will be described. The address information "ADD1" is transferred to the register 14 by the logic controller 13 and the input/output circuit 12.

Subsequently, the memory controller 2 generates the address information ADD2 over five cycles, for example, and transmits the address information ADD2 to the semiconductor memory device 1. The address information ADD2 includes, for example, a column address and a row address. The row address includes a plane address. The plane address designates a target plane PB. A case where the plane address designates the plane PB1 will be described. The address information ADD2 is transferred to the register 14 by the logic controller 13 and the input/output circuit 12.

Subsequently, the memory controller 2 generates the command "E0h" and transmits the command "E0h" to the semiconductor memory device 1. The command "E0h" is a command used to cause the semiconductor memory device 1 to start the data output operation based on the address information ADD1 and ADD2 received after the reception of the command "05h". The command "E0h" is transferred to the register 14 by the logic controller 13 and the input/output circuit 12.

In response to receiving the command "E0h", the sequencer 15 controls the data register DR, the column decoder CD, and the like of the target plane PB by the method designated by the prefix command "XXh", and starts the data output operation. This is specifically as follows.

For example, based on a control signal supplied from the sequencer 15, for each division DIV of the plane PB0, the compression circuit CMPe generates the compressed data DCe[3:0] based on the data De[7:0] held in the data latch group DLGe, and the compression circuit CMPo generates the compressed data DCo[3:0] based on the data Do[7:0] held in the data latch group DLGo. The compressed data DCe[3:0] is held in the data latch circuits XDL<3:0> of the data latch group DLGe, and the compressed data DCo[3:0] is held in the data latch circuits XDL<3:0> of the data latch group DLGo.

Similarly, for each division DIV of the plane PB1, the compression circuit CMPe generates the compressed data DCe[7:4] based on the data De[7:0], and the compression circuit CMPo generates the compressed data DCo[7:4] based on the data Do[7:0]. The compressed data DCe[7:4] is held in the data latch circuits XDL<7:4> of the data latch group DLGe, and the compressed data DCo[7:4] is held in the data latch circuits XDL<7:4> of the data latch group DLGo.

For example, the operation of ST12 illustrated in FIG. 16 is implemented in this manner.

Subsequently, the multiplexer MUX selects both the plane PB0 and the plane PB1 based on the plane address in the address information ADD1 and the plane address in the address information ADD2.

For example, based on a control signal supplied from the sequencer 15, the compressed data DCe[3:0] and the compressed data DCo[3:0] held in each division DIV of the plane PB0 are transferred to the input/output circuit 12 and transmitted from the input/output circuit 12 to the memory controller 2 via signals DQ<3:0>. In FIG. 17, the data transferred and transmitted in this manner is illustrated as compressed data DC0.

Similarly, the compressed data DCe[7:4] and the compressed data DCo[7:4] held in each division DIV of the plane PB1 are transferred to the input/output circuit 12 and transmitted from the input/output circuit 12 to the memory controller 2 via the signals DQ<7:4>. In FIG. 17, the data transferred and transmitted in this manner is illustrated as compressed data DC1.

As illustrated in FIG. 17, the transmission of the compressed data DC0 to the memory controller 2 via the signals DQ<3:0> and the transmission of the compressed data DC1 to the memory controller 2 via the signals DQ<7:4> are executed in parallel. For the transmission of the signals DQ<7:0> by the semiconductor memory device 1, an external terminal that differs for each signal DQ is used.

The fact that the transmission of the compressed data DC0 and the transmission of the compressed data DC1 are executed in parallel means that, for example, the time when the transmission of the compressed data DC0 is started and the time when the transmission of the compressed data DC1 is started are substantially the same, and the time when the transmission of the compressed data DC0 is ended and the time when the transmission of the compressed data DC1 is ended are substantially the same. Further, the fact that the transmission of the compressed data DC0 and the transmission of the compressed data DC1 are executed in parallel may mean that a period from the time when the transmission of the compressed data DC0 is started to the time when the transmission of the compressed data DC0 is ended and a period from the time when the transmission of the compressed data DC1 is started to the time when the transmission of the compressed data DC1 is ended partially overlap with each other.

For example, the operation of ST13 illustrated in FIG. 16 is executed in this manner.

The command set described above is merely an example. For example, the memory controller 2 may generate a command set including the command "05h", the address information ADD1, the command "05h", the address information ADD2, and the command "E0h" in order of appearance from the top, and transmit the command set to the semiconductor memory device 1. The semiconductor memory device 1 can execute the above-described data output operation based on the command set.

In the above description, the case has been described where the command set for the data output operation includes the prefix command for outputting the data read from the plurality of planes PB in parallel and transmitting the data to the memory controller 2. Such a prefix command may be included, for example, in a command set for a read operation. In this case, compressed data of data read from a certain plane PB may be generated based on the prefix command, compressed data of data read from another plane PB may be generated based on the prefix command, and a data output operation of outputting the compressed data from the two planes PB to the memory controller 2 may be triggered by the toggling of the read enable signal bRE.

(3) Details of Data Transfer Processing and Data Output Processing

The semiconductor memory device 1 transfers the compressed data DCe[3:0] and the compressed data DCo[3:0] from each division DIV of the plane PB0 to the input/output circuit 12 and transfers the compressed data DCe[7:4] and the compressed data DCo[7:4] from each division DIV of the plane PB1 to the input/output circuit 12 via different data buses in parallel as described with reference to FIG. 17. This is specifically as follows.

Figure 18:
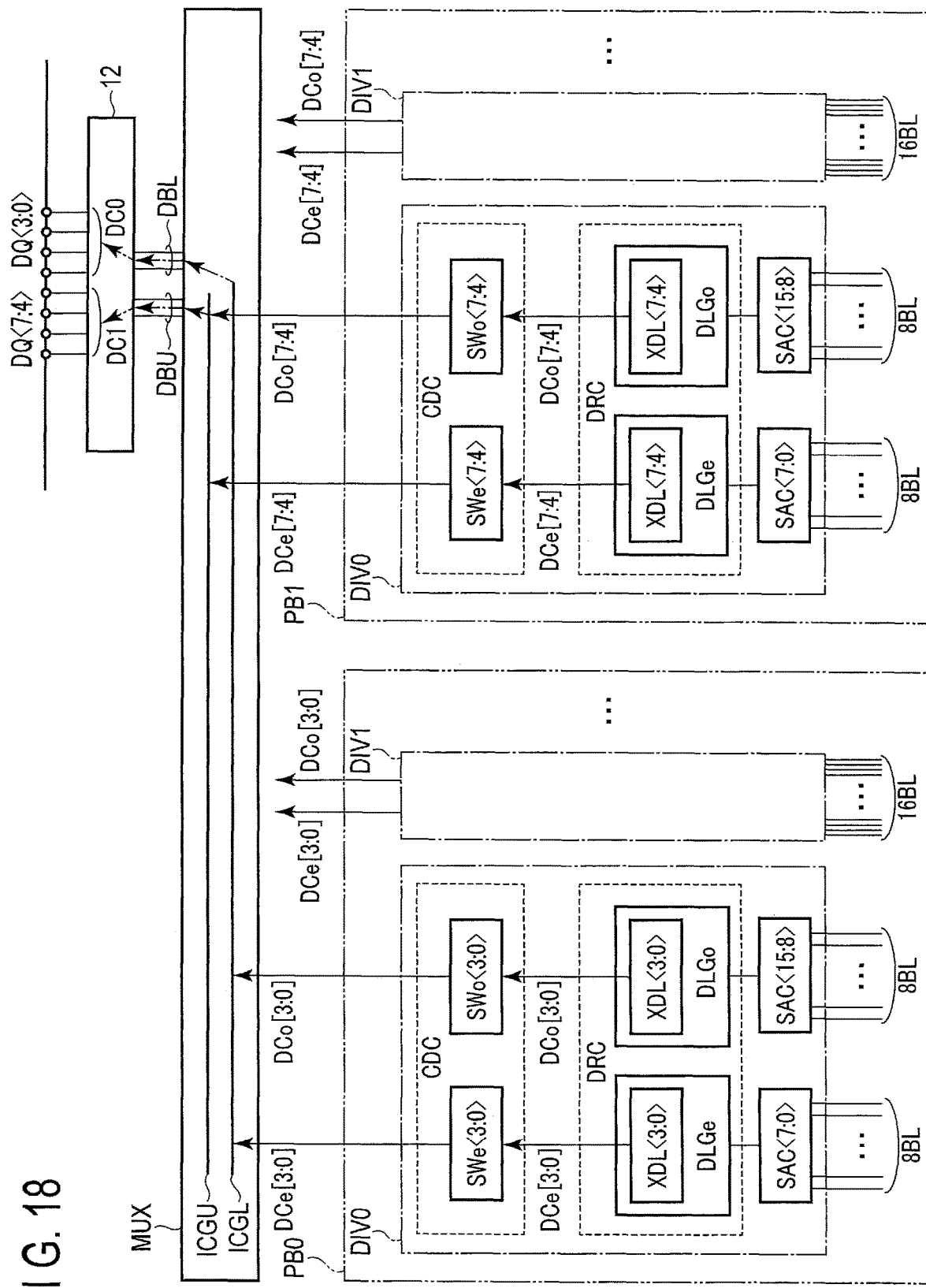
FIG. 18 is a diagram for describing parallel transfer of compressed data from a certain plane and compressed data from another plane to the input/output circuit in the semiconductor memory device according to the first embodiment and parallel transmission of the compressed data from the certain plane and the compressed data from the other plane to a memory controller.

FIG. 18 is a diagram for describing parallel transfer of compressed data from the plane PB0 and compressed data from the plane PB1 to the input/output circuit 12 in the semiconductor memory device 1 according to the first embodiment and parallel transmission of the compressed data from the plane PB0 and the compressed data from the plane PB1 to the memory controller 2.

As described with reference to FIG. 17, for each division DIV of the plane PB0, the compressed data DCe[3:0] is held in the data latch circuits XDL<3:0> of the data latch group DLGe, and the compressed data DCo[3:0] is held in the data latch circuits XDL<3:0> of the data latch group DLGo.

Each division DIV of the plane PB0 transfers the compressed data DCe[3:0] and the compressed data DCo[3:0] to the multiplexer MUX via the switches SWe<3:0> and the switches SWo<3:0> of the column decoder circuit CDC. The transfer is performed for each division DIV based on the column address in the address information ADD held in the register 14. FIG. 18 illustrates an example of a case where the transfer from the division DIV0 is performed first and the transfer from the division DIV1 is performed next.

As described with reference to FIG. 10, the compressed data DCe[3:0] and the compressed data DCo[3:0] transferred from each division DIV of the plane PB0 is transmitted via the interconnect group ICGL in the multiplexer MUX and transferred from the multiplexer MUX to the input/output circuit 12 via the data bus DBL. The transmission and transfer are performed, for example, for each division DIV. The data transferred from the plane PB0 in this manner corresponds to the compressed data DC0 described with reference to FIG. 17.

As described with reference to FIG. 17, for each division DIV of the plane PB1, the compressed data DCe[7:4] is held in the data latch circuits XDL<7:4> of the data latch group DLGe, and the compressed data DCo[7:4] is held in the data latch circuits XDL<7:4> of the data latch group DLGo.

Each division DIV of the plane PB1 transfers the compressed data DCe[7:4] and the compressed data DCo[7:4] to the multiplexer MUX via the switches SWe<7:4> and the switches SWo<7:4> of the column decoder circuit CDC. The transfer is performed for each division DIV based on the column address in the address information ADD held in the register 14. FIG. 18 illustrates an example of a case where the transfer from the division DIV0 is performed first and the transfer from the division DIV1 is performed next.

For example, a period in which the switches SWe<3:0> and the switches SWo<3:0> are turned on in the first division DIV0 of the plane PB0 and a period in which the switches SWe<7:4> and the switches SWo<7:4> are turned on in the first division DIV0 of the plane PB1 may overlap at least partially. The same applies to the other divisions of the planes PB0 and PB1.

As described with reference to FIG. 10, the compressed data DCe[7:4] and the compressed data DCo[7:4] transferred from each division DIV of the plane PB1 is transmitted via the interconnect group ICGU in the multiplexer MUX and transferred from the multiplexer MUX to the input/output circuit 12 via the data bus DBU. The transmission and transfer are performed, for example, for each division DIV. The data transferred from the plane PB1 in this manner corresponds to the compressed data DC1 described with reference to FIG. 17.

The input/output circuit 12 receives the compressed data DC0 and the compressed data DC1 transferred in parallel in this manner, and transmits the compressed data DC0 via the signals DQ<3:0> and the compressed data DC1 via the signals DQ<7:4> to the memory controller 2 in parallel.

The transmission of the compressed data DC0 via the signals DQ<3:0> is performed, for example, for each division DIV of the plane PB0. Specifically, 8-bit data in total of the compressed data DCe[3:0] and the compressed data DCo[3:0] from a single division DIV is transmitted in a single cycle of the toggled signals DQS and bDQS.

The transmission of the compressed data DC1 via the signals DQ<7:4> is performed, for example, for each division DIV of the plane PB1. Specifically, 8-bit data in total of the compressed data DCe[7:4] and the compressed data DCo[7:4] from a single division DIV is transmitted in a single cycle of the toggled signals DQS and bDQS.

[Effects]

The semiconductor memory device 1 according to the first embodiment causes, for each of the planes PB0 and PB1, soft bit data read from the memory cell array MCA in the plane PB to be held in the data register DR, for example. More specifically, the semiconductor memory device 1 causes the data register circuit DRC of each division DIV of the plane PB to hold the data De[7:0] and the data Do[7:0]. The data register circuit DRC includes, for example, the compression circuits CMPe and CMPo.

For each division DIV of the plane PB0, the compression circuit CMPe generates the compressed data DCe[3:0] based on the data De[7:0], and the compression circuit CMPo generates the compressed data DCo[3:0] based on the data Do[7:0]. Similarly, for each division DIV of the plane PB1, the compression circuit CMPe generates the compressed data DCe[7:4] based on the data De[7:0], and the compression circuit CMPo generates the compressed data DCo[7:4] based on the data Do[7:0].

The multiplexer MUX of the semiconductor memory device 1 selects both the plane PB0 and the plane PB1 in the data output operation.

The semiconductor memory device 1 transmits the compressed data DCe[3:0] and the compressed data DCo[3:0] from each division DIV of the plane PB0 via the interconnect group ICGL in the multiplexer MUX, transfers the compressed data DCe[3:0] and the compressed data DCo[3:0] from the multiplexer MUX to the input/output circuit 12 via the data bus DBL, and transmits the compressed data DCe[3:0] and the compressed data DCo[3:0] from the input/output circuit 12 to the memory controller 2 via the signals DQ<3:0>. In FIG. 17, the data transferred and transmitted in this manner is illustrated as compressed data DC0. Specifically, in the transmission of the compressed data DC0 via the signals DQ<3:0>, for example, 8-bit data in total of the compressed data DCe[3:0] and the compressed data DCo[3:0] from a single division DIV is transmitted in a single cycle of the toggled signals DQS and bDQS. This means that substantially 16 bits in total of the data before the compression read from the memory cell array MCA0 of the plane PB0 are transmitted via the signals DQ<3:0> in a single cycle of the signals DQS and bDQS.

The semiconductor memory device 1 transmits the compressed data DCe[7:4] and the compressed data DCo[7:4] from each division DIV of the plane PB1 via the interconnect group ICGU in the multiplexer MUX, transfers the compressed data DCe[7:4] and the compressed data DCo[7:4] from the multiplexer MUX to the input/output circuit 12 via the data bus DBU, and transmits the compressed data DCe[7:4] and the compressed data DCo[7:4] from the input/output circuit 12 to the memory controller 2 via the signals DQ<7:4>. In FIG. 17, the data transferred and transmitted in this manner is illustrated as compressed data DC1. Specifically, in the transmission of the compressed data DCI via the signals DQ<7:4>, 8-bit data in total of the compressed data DCe[7:4] and the compressed data DCo[7:4] from a single division DIV is transmitted in a single cycle of the toggled signals DQS and bDQS. This means that substantially 16 bits in total of the data before the compression read from the memory cell array MCA1 of the plane PB1 are transmitted via the signals DQ<7:4> in a single cycle of the signals DQS and bDQS.

The semiconductor memory device 1 can transfer the compressed data DC0 and the compressed data DC1 in parallel, and further transmit the compressed data DC0 and the compressed data DC1 to the memory controller 2 in parallel. This is because, as described above, the data buses and the signals DQ respectively involved in the transfer and transmission of the compressed data DC0 are different from the data buses and the signals DQ respectively involved in the transfer and transmission of the compressed data DC1.

As described above, the semiconductor memory device 1 according to the first embodiment can transmit data from the two planes PB to the memory controller 2 in parallel. Focusing on the transmission of data from a single plane PB of the two planes PB, the efficiency of moving the data in the transmission of the data is substantially the same as that when the semiconductor memory device 1 transmits the data before compression read from the memory cell array MCA of the plane PB as it is to the memory controller 2. Therefore, according to the semiconductor memory device 1 according to the first embodiment, the efficiency of moving data from the semiconductor memory device 1 to the memory controller 2 can be improved.

Furthermore, in the example of FIG. 11, the compression circuit CMPe can be implemented as, for example, the arithmetic circuit LC coupled to the buses LBUS0, LBUS1, LBUS2, . . . , and LBUS7. The same applies to the other compression circuits CMP. Therefore, according to the semiconductor memory device 1 according to the first embodiment, it is possible to improve the above-described data movement efficiency while suppressing an increase in the circuit area.

Modification

The compressed data generated from the original data IO[7:0] of the 9 cases is described above with reference to FIGS. 14 and 15. Compressed data generated based on the conversion described with reference to FIG. 15 from the original data IO[7:0] in the case where two or more bits of "1" data are present among the 0th to 7th bits will be described below.

As described with reference to FIG. 13, since the bits of "1" data among the bits of the soft bit data SB1 are present only at a very low ratio, for example, 1% or less, such compressed data is hardly generated by compressing data of a part of the soft bit data. Furthermore, as described below, even if such compressed data is generated, the memory controller 2 can recognize the fact. Therefore, even if such compressed data is generated, the error check and correction circuit 26 can perform the error correction processing with sufficient accuracy.

Compressed data generated based on the conversion described with reference to FIG. 15 from the original data IO[7:0] in 28 cases in total where only two bits of "1" data are present among the 0th to 7th bits will be described below with reference to FIGS. 19 and 20.

FIG. 19 is a diagram for describing compressed data generated by a compression circuit CMP of a semiconductor memory device 1 according to a modification of the first embodiment. FIG. 19 illustrates 12 cases out of the 28 cases described above.

In a case (case CS02) where only the data (data IO[0]) of the 0th bit and the data (data IO[2]) of the 2nd bit among the original data IO[7:0] are "1" data, the compressed data is as follows.

In the compressed data, the data of the 1st bit and the 3rd bit is "0" data, and the data of the 0th bit and the 2nd bit is "1" data. The compressed data matches the compressed data in the case (case CS4) where only the data (data IO[4]) of the 4th bit among the original data IO[7:0] is "1" data. The case CS4 is described above with reference to FIG. 14.

Therefore, upon receiving the compressed data of the case CS02, the memory controller 2 may generate the same data as the original data IO[7:0] of the case CS4 based on the received compressed data. As a result, the memory controller 2 erroneously detects that the data IO[4] is "1" data although the data IO[4] is "0" data in the original data IO[7:0]. Such erroneous detection that data of a certain bit is "1" data even though the data of the bit is "0" data is hereinafter referred to as erroneous detection.

Similar erroneous detection may be performed by the memory controller 2 in the case CS03, the case CS13, and the case CS23 illustrated in FIG. 19. That is, such erroneous detection may be performed by the memory controller 2 only in 4 cases out of the total of 28 cases where only two bits of "1" data are present among the 0th to 7th bits of the original data IO[7:0].

In a case (case CS04) where only the data (data IO[0]) of the 0th bit and the data (data IO[4]) of the 4th bit among the original data IO[7:0] are "1" data, the compressed data is as follows.

In the compressed data, the data of the 1st bit and the 3rd bit is "0" data, and the data of the 0th bit and the 2nd bit is "1" data. The compressed data matches the compressed data in the case (case CS4) where only the data (data IO[4]) of the 4th bit among the original data IO[7:0] is "1" data. The case CS4 is described above with reference to FIG. 14.

Therefore, upon receiving the compressed data of the case CS04, the memory controller 2 may generate the same data as the original data IO[7:0] of the case CS4 based on the received compressed data. As a result, the memory controller 2 correctly detects that the data IO[4] is "1" data in the original data IO[7:0] although the memory controller 2 does not detect that the data IO[0] is "1" data in the original data IO[7:0]. The detection of only 1-bit "1" data among 2-bit "1" data in this manner is hereinafter referred to as 1-bit detection.

Similar 1-bit detection may be performed by the memory controller 2 in the case CS05, the case CS16, the case CS24, the case CS27, the case CS35, the case CS36, and the case CS37 illustrated in FIG. 19. That is, such 1-bit detection may be performed by the memory controller 2 in 8 cases out of the total of 28 cases where only two bits of "1" data are present among the 0th to 7th bits of the original data IO[7:0].

FIG. 20 is a diagram for describing compressed data generated by a compression circuit CMP of the semiconductor memory device 1 according to the modification of the first embodiment. FIG. 20 illustrates 16 cases out of the 28 cases described above.

In a case (case CS01) where only the data (data IO[0]) of the 0th bit and the data (data IO[1]) of the 1st bit among the original data IO[7:0] are "1" data, the compressed data is as follows.

In the compressed data, the data of the 2nd bit and the 3rd bit is "0" data, and the data of the 0th bit and the 1st bit is "1" data. The compressed data does not match the compressed data of any case CS described with reference to FIG. 14.

Therefore, upon receiving the compressed data of the case CS01, the memory controller 2 does not generate data based on the received compressed data, for example, unlike the case of the erroneous detection and the 1-bit detection described above. Instead, for example, the memory controller 2 may detect that the received compressed data is not proper. Such detection that the compressed data is not proper is hereinafter referred to as irregular detection. As a result, the memory controller 2 can recognize that two or more bits of "1" data are present among the 0th to 7th bits of the original data IO[7:0].

Similar irregular detection may be performed by the memory controller 2 in the other 15 cases CS illustrated in FIG. 20. That is, such irregular detection may be performed by the memory controller 2 in the 16 cases out of the 28 cases where only two bits of "1" data are present among the 0th to 7th bits of the original data IO[7:0].

That is, regarding 56 cases in total where only three bits of "1" data are present among the 0th to 7th bits of the original data IO[7:0], 1-bit detection similar to that described above may be performed by the memory controller 2 in 4 cases out of the 56 cases, and irregular detection similar to that described above may be performed in the 52 cases out of the 56 cases.

The same applies to a case where four bits of the "1" data are present among the 0th to 7th bits of the original data IO[7:0].

Second Embodiment

A semiconductor memory device 1a according to a second embodiment will be described below.

The configuration of the semiconductor memory device 1a according to the second embodiment will be mainly described in terms of differences from the configuration of the semiconductor memory device 1 according to the first embodiment.

As a description of a memory system 3a including the semiconductor memory device 1a, in the description of FIG. 1, the memory system 3 is replaced with the memory system 3a, and the semiconductor memory device 1 is replaced with the semiconductor memory device 1a.

FIG. 21 is a block diagram illustrating an example of the configuration of the semiconductor memory device 1a according to the second embodiment.

The semiconductor memory device 1a is obtained by replacing the core unit 11 with a core unit 11a in the semiconductor memory device 1 according to the first embodiment. The core unit 11a is obtained by replacing the four planes PB0, PB1, PB2, and PB3 with four planes PBa0, PBa1, PBa2, and PBa3 in the core unit 11. For the semiconductor memory device 1a, the same description as the description made for the semiconductor memory device 1 according to the first embodiment with reference to FIG. 2 holds true.

FIG. 22 is a block diagram illustrating an example of a configuration of the core unit 11a of the semiconductor memory device 1a according to the second embodiment.

The plane PBa0 is obtained by replacing the column decoder CD0 with a column decoder CDa0 and replacing the data register DR0 with a data register DRa0 in the plane PB0 of the semiconductor memory device 1 according to the first embodiment. The same applies to the other planes PBa. For the core unit 11a, the same description as the description made for the core unit 11 of the semiconductor memory device 1 according to the first embodiment with reference to FIG. 3 holds true.

Figure 23:
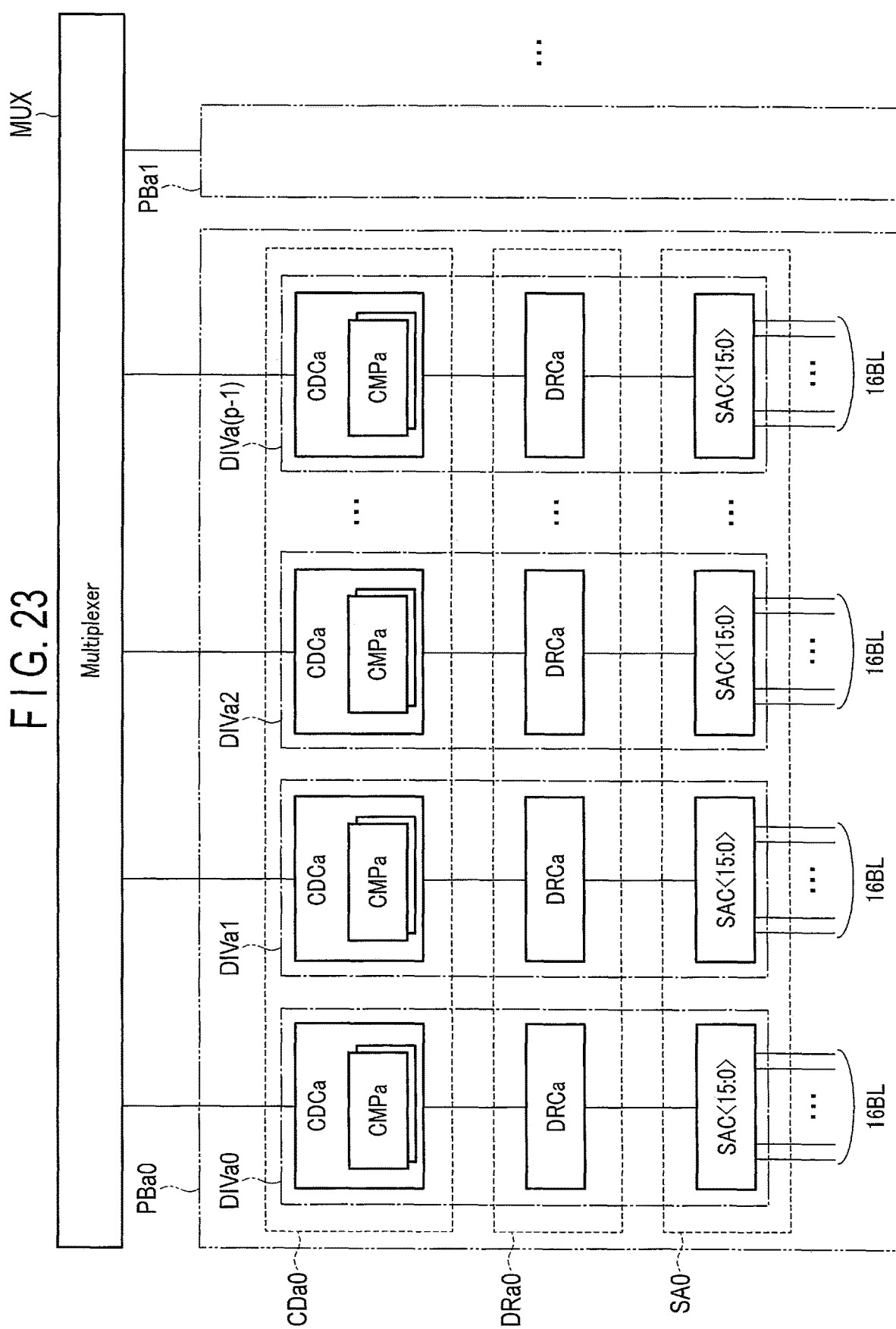
FIG. 23 is a diagram for describing in detail a configuration of each of planes of the semiconductor memory device according to the second embodiment.

FIG. 23 is a diagram for describing in detail a configuration of each of the planes PBa of the semiconductor memory device 1a according to the second embodiment.

Although the configuration of the plane PBa0 will be described below, each of the other planes PBa has a configuration similar to that described for the plane PBa0.

The plane PBa0 corresponds to a plane in which each column decoder circuit CDC includes two compression circuits CMPa and two compression circuits CMP are removed from each data register circuit DRC in the plane PB0. For such changes in the configuration, the sign given to each column decoder circuit is changed from CDC to CDCa, the sign given to each data register circuit is changed from DRC to DRCa, and the sign given to each division is also changed from DIV to DIVa.

A set of the column decoder circuits CDCa of all the divisions DIVa of the plane PBa0 constitutes the column decoder CDa0. A combination of the data register circuits DRCa of all the divisions DIVa of the plane PBa0 constitutes the data register DRa0.

Figure 24:
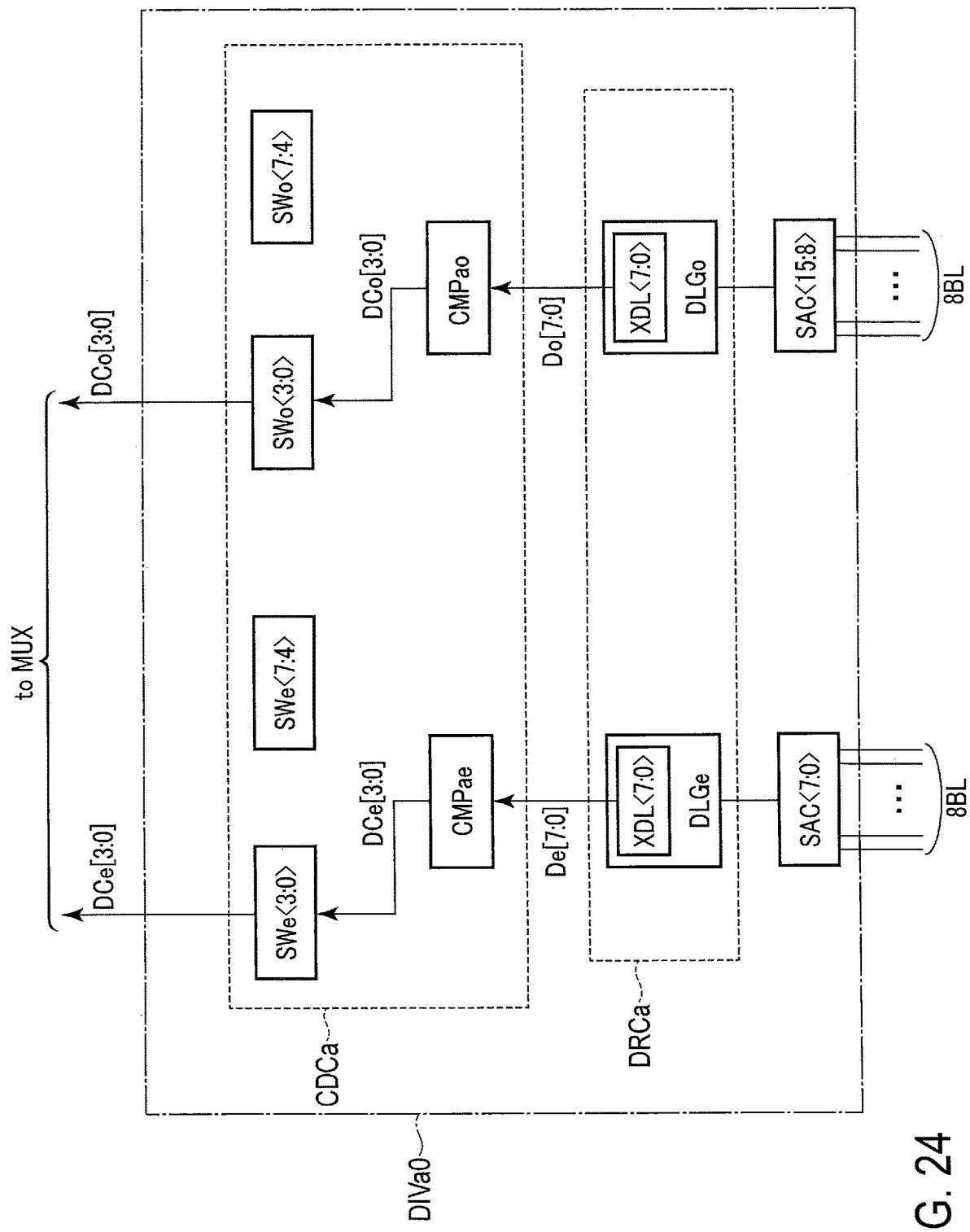
FIG. 24 is a diagram for describing an example of data transfer via a division of a plane of the semiconductor memory device according to the second embodiment.

FIG. 24 is a diagram for describing an example of data transfer via a division DIVa0 of the plane PBa0 of the semiconductor memory device 1a according to the second embodiment.

The two compression circuits CMPa illustrated in FIG. 23 are illustrated as compression circuits CMPae and CMPao in FIG. 24. The compression circuit CMPae is associated with the data latch group DLGe. The compression circuit CMPao is associated with the data latch group DLGo.

As described with reference to FIG. 8, the data register circuit DRCa generates the data De[7:0] and the data Do[7:0], the data De[7:0] is held in the data latch group DLGe, and the data Do[7:0] is held in the data latch group DLGo. More specifically, for example, the data De[7:0] is held in the eight data latch circuits XDL<7:0> of the data latch group DLGe, and the data Do[7:0] is held in the eight data latch circuits XDL<7:0> of the data latch group DLGo.

For example, the data latch group DLGe transfers the data De[7:0] to the compression circuit CMPae. The compression circuit CMPae receives the data De[7:0] transferred from the data latch group DLGe and generates, based on the data De[7:0], compressed data DCe[3:0] equivalent to that in the example of FIG. 9. The compression circuit CMPae transfers the compressed data DCe[3:0] to the switches SWe<3:0>. The switches SWe<3:0> can transfer the compressed data DCe[3:0] to the multiplexer MUX as described with reference to FIG. 9.

For example, the data latch group DLGo transfers the data Do[7:0] to the compression circuit CMPao. The compression circuit CMPao receives the data Do[7:0] transferred from the data latch group DLGo and generates, based on the data Do[7:0], compressed data DCo[3:0] equivalent to that in the example of FIG. 9. The compression circuit CMPao transfers the compressed data DCo[3:0] to the switches SWo<3:0>. The switches SWo<3:0> can transfer the compressed data DCo[3:0] to the multiplexer MUX as described with reference to FIG. 9.

Although the example in which the compressed data is transferred to the switches SWe<3:0> and the switches SWo<3:0> has been described above, the compressed data may be transferred to the switches SWe<7:4> and the switches SWo<7:4> instead of the switches SWe<3:0> and the switches SWo<3:0> as in the example of FIG. 9.

Figure 25:
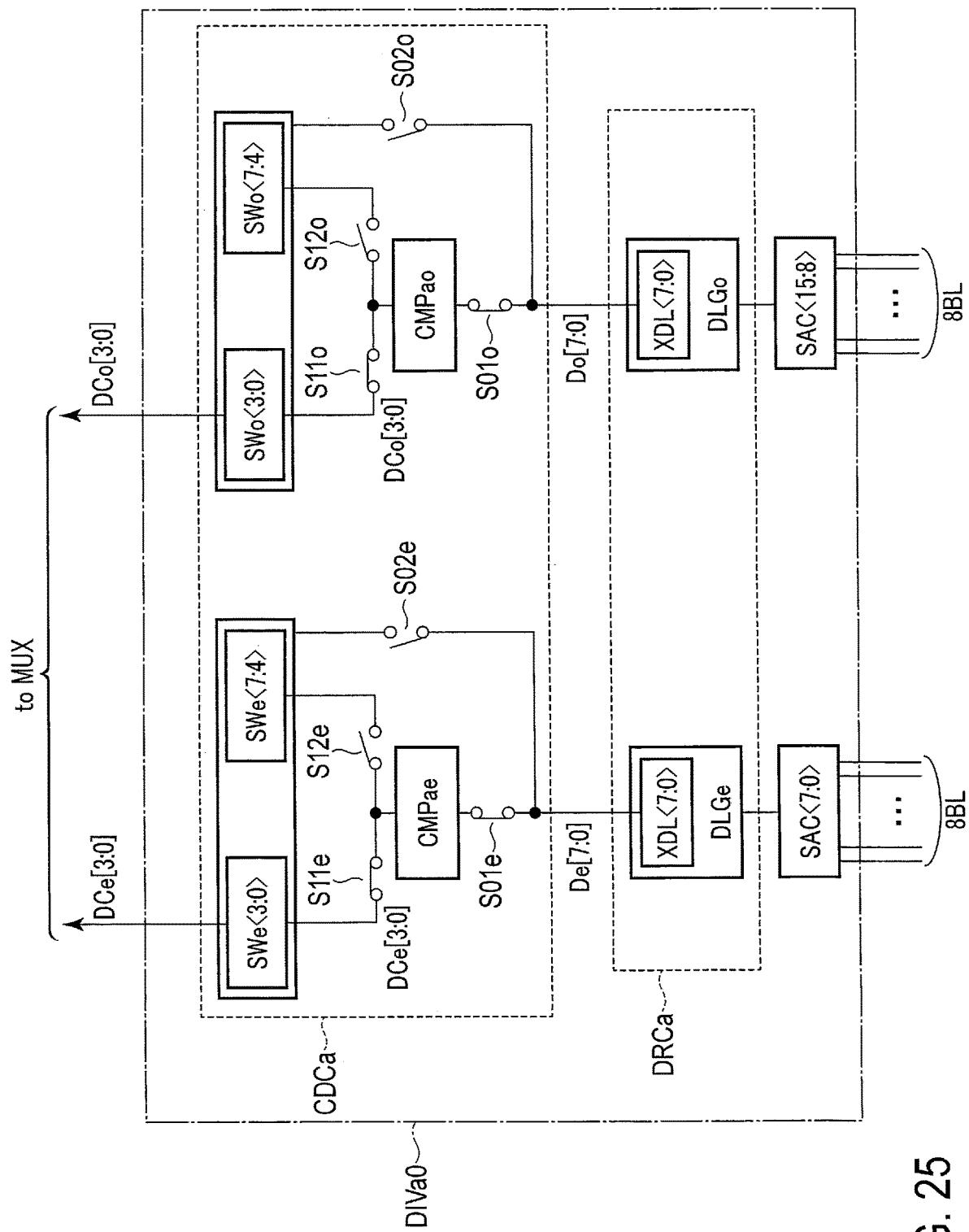
FIG. 25 illustrates an example of a configuration of a column decoder circuit of the division of the semiconductor memory device according to the second embodiment.

FIG. 25 illustrates an example of a configuration of the column decoder circuit CDCa of the division DIVa0 of the semiconductor memory device 1a according to the second embodiment.

For example, a switch S01e is provided between the data latch circuits XDL<7:0> of the data latch group DLGe and the compression circuit CMPae. While the switch S01e is in its ON state, the data De[7:0] can be transferred from the data latch circuits XDL<7:0> to the compression circuit CMPae. The switch S01e is, for example, a set of switches prepared for each bit of data to be transferred by the switch S01e. The same applies to other switches S with similar notation. Whether the switch S01e is in its ON state or its OFF state is controlled based on, for example, a control signal supplied from the sequencer 15. The same applies to the other switches S with similar notation.

For example, a switch S02e is provided between the data latch circuits XDL<7:0> and the switches SWe<7:0>. While the switch S02e is in its ON state, the data De[7:0] can be transferred from the data latch circuits XDL<7:0> to the switches SWe<7:0>.

The transfer of the data De[7:0] to the compression circuit CMPae described with reference to FIG. 24 is implemented by turning on the switch S01e and turning off the switch S02e. On the other hand, when the switch S01e is turned off and the switch S02e is turned on, the data De[7:0] is transferred to the switches SWe<7:0> as in the example of FIG. 8.

For example, a switch S11e is provided between the compression circuit CMPae and the switches SWe<3:0>. While the switch S11e is in its ON state, the compressed data DCe[3:0] can be transferred from the compression circuit CMPae to the switches SWe<3:0>.

For example, a switch S12e is provided between the compression circuit CMPae and the switches SWe<7:4>. While the switch S12e is in its ON state, the compressed data can be transferred from the compression circuit CMPae to the switches SWe<7:4>.

In this manner, the compression circuit CMPae is coupled in series between the data latch group DLGe and the switches SWe<7:0>.

The transfer of the compressed data DCe[3:0] to the switches SWe<3:0> described with reference to FIG. 24 is implemented by turning on the switch S11e and turning off the switch S12e. On the other hand, when the switch S11e is turned off and the switch S12e is turned on, the compressed data is transferred to the switches SWe<7:4> as in the example of FIG. 9.

For example, a switch S01o is provided between the data latch circuits XDL<7:0> of the data latch group DLGo and the compression circuit CMPao. While the switch S01o is in its ON state, the data Do[7:0] can be transferred from the data latch circuits XDL<7:0> to the compression circuit CMPao.

For example, a switch S02o is provided between the data latch circuits XDL<7:0> and the switches SWo<7:0>. While the switch S02o is in its ON state, the data Do[7:0] can be transferred from the data latch circuits XDL<7:0> to the switches SWo<7:0>.

The transfer of the data Do[7:0] to the compression circuit CMPao described with reference to FIG. 24 is implemented by turning on the switch S01o and turning off the switch S02o. On the other hand, when the switch S01o is turned off and the switch S02o is turned on, the data Do[7:0] is transferred to the switches SWo<7:0> as in the example of FIG. 8.

For example, a switch S11o is provided between the compression circuit CMPao and the switches SWo<3:0>. While the switch S11o is in its ON state, the compressed data DCo[3:0] can be transferred from the compression circuit CMPao to the switches SWo<3:0>.

For example, a switch S12o is provided between the compression circuit CMPao and the switches SWo<7:4>. While the switch S12o is in its ON state, the compressed data can be transferred from the compression circuit CMPao to the switches SWo<7:4>.

In this manner, the compression circuit CMPao is coupled in series between the data latch group DLGo and the switches SWo<7:0>.

The transfer of the compressed data DCo[3:0] to the switches SWo<3:0> described with reference to FIG. 24 is implemented by turning on the switch S11o and turning off the switch S12o. On the other hand, when the switch S11o is turned off and the switch S12o is turned on, the compressed data is transferred to the switches SWo<7:4> as in the example of FIG. 9.

Therefore, according to the semiconductor memory device 1a according to the second embodiment, the efficiency of moving data from the semiconductor memory device 1a to the memory controller 2 can be improved as in the semiconductor memory device 1 according to the first embodiment.

Further, in the examples of FIGS. 24 and 25, for example, the compression circuit CMPae receives the 8 bits of the data De[7:0] from the data latch circuits XDL<7:0> of the data latch group DLGe in parallel, and generates the compressed data DCe[3:0] based on the data De[7:0]. The same applies to the other compression circuits CMPa. Therefore, according to the semiconductor memory device 1a according to the second embodiment, the generation of the compressed data by each compression circuit CMPa is faster than that of the semiconductor memory device 1 according to the first embodiment, and thus the above-described data movement efficiency can be further improved.

Third Embodiment

A semiconductor memory device 1b according to a third embodiment will be described below.

The configuration of the semiconductor memory device 1b according to the third embodiment will be mainly described in terms of differences from the configuration of the semiconductor memory device 1 according to the first embodiment.

As a description of a memory system 3b including the semiconductor memory device 1b, in the description of FIG. 1, the memory system 3 is replaced with the memory system 3b, and the semiconductor memory device 1 is replaced with the semiconductor memory device 1b.

FIG. 26 is a block diagram illustrating an example of the configuration of the semiconductor memory device 1b according to the third embodiment.

The semiconductor memory device 1b is obtained by replacing the core unit 11 with a core unit 11b in the semiconductor memory device 1 according to the first embodiment. For the semiconductor memory device 1b, the same description as the description made for the semiconductor memory device 1 according to the first embodiment with reference to FIG. 2 holds true.

Figure 27:
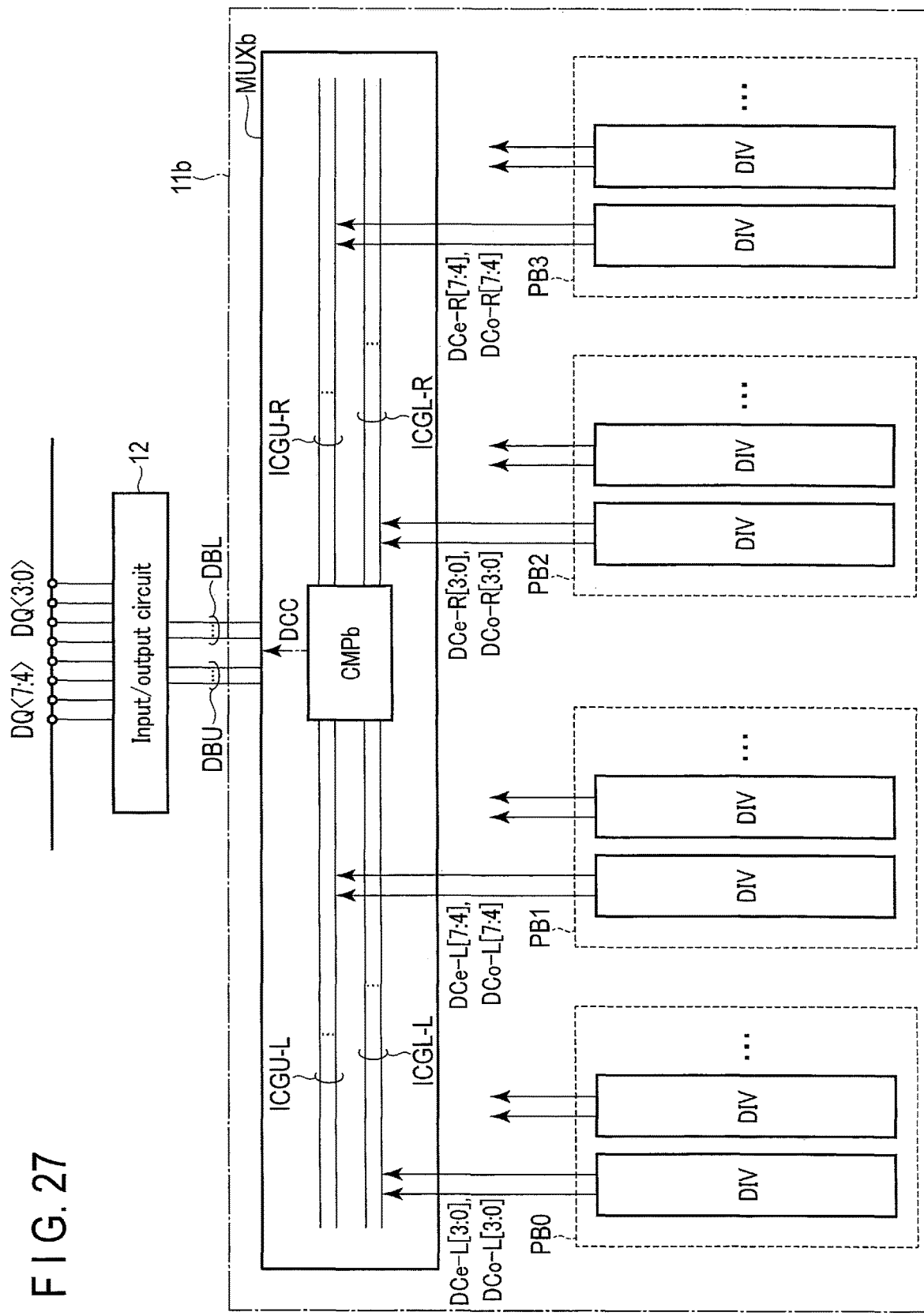
FIG. 27 illustrates an example of a configuration of a core unit of the semiconductor memory device according to the third embodiment.

FIG. 27 illustrates an example of a configuration of the core unit 11b of the semiconductor memory device 1b according to the third embodiment.

The core unit lib is obtained by replacing the multiplexer MUX with a multiplexer MUXb in the core unit 11 of the semiconductor memory device 1 according to the first embodiment. The multiplexer MUXb includes a compression circuit CMPb.

The multiplexer MUXb includes, as data buses, a interconnect group ICGL-L, a interconnect group ICGU-L, a interconnect group ICGL-R, and a interconnect group ICGU-R. The interconnect group ICGL-L, the interconnect group ICGU-L, the interconnect group ICGL-R, and the interconnect group ICGU-R are coupled to the compression circuit CMPb. The multiplexer MUXb is coupled to the input/output circuit 12 via, for example, the data bus DBL and the data bus DBU.

The interconnect group ICGL-L is a transmission path of data transferred from each division DIV of the planes PB0 and PB1 via the switches SWe<3:0> and the switches SWo<3:0>. On the other hand, the interconnect group ICGU-L is a transmission path of data transferred from each division DIV of the planes PB0 and PB1 via the switches SWe<7:4> and the switches SWo<7:4>.

The interconnect group ICGL-R is a transmission path of data transferred from each division DIV of the planes PB2 and PB3 via the switches SWe<3:0> and the switches SWo<3:0>. On the other hand, the interconnect group ICGU-R is a transmission path of data transferred from each division DIV of the planes PB2 and PB3 via the switches SWe<7:4> and the switches SWo<7:4>.

A case where, for example, soft bit data is read to the data register DR for each of the plane PB0, the plane PB1, the plane PB2, and the plane PB3 by a read operation will be described below. More specifically, for each of the planes PB0, PB1, PB2, and PB3, the data De[7:0] and the data Do[7:0] are held in the data latch group DLGe and the data latch group DLGo of each division DIV of the plane PB, respectively.

As described with reference to FIG. 17, for each division DIV of the plane PB0, the compressed data DCe[3:0] (compressed data DCe-L[3:0]) and the compressed data DCo[3:0] (compressed data DCo-L[3:0]) are generated by the compression circuits CMPe and CMPo based on the data De[7:0] and the data Do[7:0].

Similarly, for each division DIV of the plane PB1, the compressed data DCe[7:4] (compressed data DCe-L[7:4]) and the compressed data DCo[7:4] (compressed data DCo-L[7:4]) are generated.

Similarly, for each division DIV of the plane PB2, the compressed data DCe[3:0] (compressed data DCe-R[3:0]) and the compressed data DCo[3:0] (compressed data DCo-R[3:0]) are generated.

Similarly, for each division DIV of the plane PB3, the compressed data DCe[7:4] (compressed data DCe-R[7:4]) and the compressed data DCo[7:4] (compressed data DCo-R[7:4]) are generated.

Subsequently, the multiplexer MUXb selects the planes PB0, PB1, PB2, and PB3, and the semiconductor memory device 1b operates as follows.

Each division DIV of the plane PB0 transfers the compressed data DCe-L[3:0] and the compressed data DCo-L[3:0] to the multiplexer MUXb in a similar manner to that described with reference to FIG. 18. The transfer is performed, for example, for each division DIV. The compressed data DCe-L[3:0] and the compressed data DCo-L[3:0] from each division DIV of the plane PB0 is transmitted via the interconnect group ICGL-L in the multiplexer MUXb. The transmission is performed, for example, for each division DIV.

Each division DIV of the plane PB1 transfers the compressed data DCe-L[7:4] and the compressed data DCo-L[7:4] to the multiplexer MUXb in a similar manner to that described with reference to FIG. 18. The transfer is performed, for example, for each division DIV. The compressed data DCe-L[7:4] and the compressed data DCo-L[7:4] from each division DIV of the plane PB1 is transmitted via the interconnect group ICGU-L in the multiplexer MUXb. The transmission is performed, for example, for each division DIV.

Each division DIV of the plane PB2 transfers the compressed data DCe-R[3:0] and the compressed data DCo-R[3:0] to the multiplexer MUXb in a similar manner to that described with reference to FIG. 18. The transfer is performed, for example, for each division DIV. The compressed data DCe-R[3:0] and the compressed data DCo-R[3:0] from each division DIV of the plane PB2 is transmitted via the interconnect group ICGL-R in the multiplexer MUXb. The transmission is performed, for example, for each division DIV.

Each division DIV of the plane PB3 transfers the compressed data DCe-R[7:4] and the compressed data DCo-R[7:4] to the multiplexer MUXb in a similar manner to that described with reference to FIG. 18. The transfer is performed, for example, for each division DIV. The compressed data DCe-R[7:4] and the compressed data DCo-R[7:4] from each division DIV of the plane PB3 is transmitted via the interconnect group ICGU-R in the multiplexer MUXb. The transmission is performed, for example, for each division DIV.

The compressed data transferred from each plane PB in this manner passes through an interconnect group different from interconnect groups through which the compressed data from the other planes PB pass in the multiplexer MUXb, and thus, the compressed data from the planes PB0, PB1, PB2, and PB3 are transmitted in parallel in the multiplexer MUXb.

The compression circuit CMPb receives the compressed data DCe-L[3:0] and the compressed data DCo-L[3:0] from a certain division DIV of the plane PB0 via the interconnect group ICGL-L. The compression circuit CMPb receives the compressed data DCe-L[7:4] and the compressed data DCo-L[7:4] from a certain division DIV of the plane PB1 via the interconnect group ICGU-L. The compression circuit CMPb receives the compressed data DCe-R[3:0] and the compressed data DCo-R[3:0] from a certain division DIV of the plane PB2 via the interconnect group ICGL-R. The compression circuit CMPb receives the compressed data DCe-R[7:4] and the compressed data DCo-R[7:4] from a certain division DIV of the plane PB3 via the interconnect group ICGU-R.

The compression circuit CMPb generates, for example, 16-bit compressed data DCC based on the 32-bit data received in this manner, and transfers the generated compressed data DCC to the input/output circuit 12 via the data bus DBL and the data bus DBU. The transfer is performed in units of 16 bits of the compressed data DCC. For example, the memory controller 2 can generate the data before the compression read from each plane PB based on the compressed data DCC.

The input/output circuit 12 receives the compressed data DCC transferred from the multiplexer MUXb and transmits the compressed data DCC to the memory controller 2 via the signals DQ<7:0>. The transmission of the compressed data DCC via the signals DQ<7:0> of 16-bit data in total is performed in a single cycle of the toggled signals DQS and bDQS.

Figure 28:
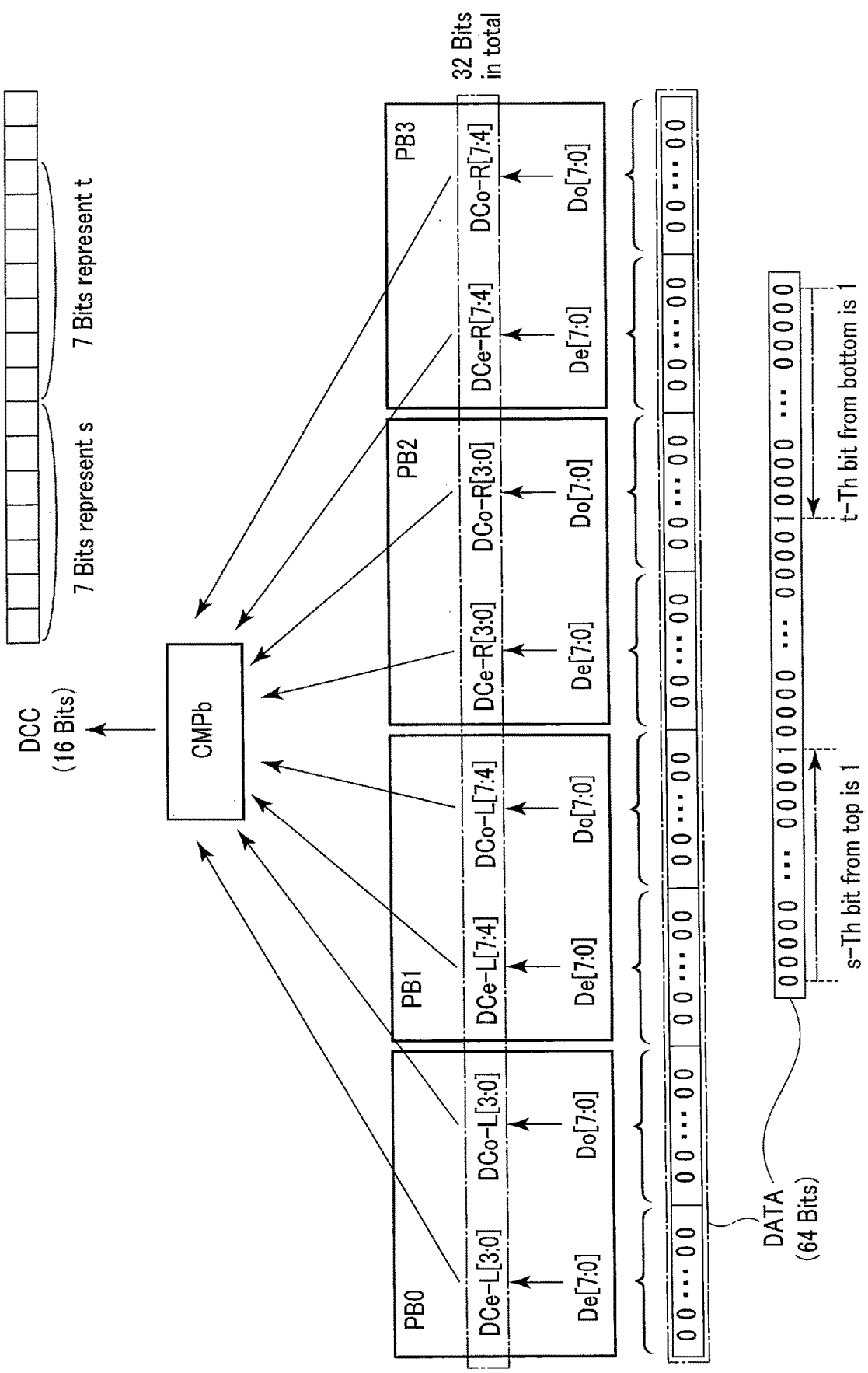
FIG. 28 is a diagram for describing compressed data generated by a compression circuit of the semiconductor memory device according to the third embodiment.

FIG. 28 is a diagram for describing the compressed data DCC generated by the compression circuit CMPb of the semiconductor memory device 1b according to the third embodiment.

Attention is paid to the data before the compression by the compression circuits CMPe and CMPo for the compressed data from each plane PB used for generating the compressed data DCC by the compression circuit CMPb.

More specifically, attention is paid to 64-bit data DATA that is a set of the data De[7:0] and the data Do[7:0] that are the data before the compression for the plane PB0, the data De[7:0] and the data Do[7:0] that are the data before the compression for the plane PB1, the data De[7:0] and the data Do[7:0] that are the data before the compression for the plane PB2, and the data De[7:0] and the data Do[7:0] that are the data before the compression for the plane PB3.

In the data DATA, for example, 8 bits of the data De[7:0] of the plane PB0, 8 bits of the data Do[7:0] of the plane PB0, 8 bits of the data De[7:0] of the plane PB1, 8 bits of the data Do[7:0] of the plane PB1, 8 bits of the data De[7:0] of the plane PB2, 8 bits of the data Do[7:0] of the plane PB2, 8 bits of the data De[7:0] of the plane PB3, and 8 bits of the data Do[7:0] of the plane PB3 are arranged in order of appearance from the top.

A case where two or less bits of "1" data are present among the 64 bits will be described. As described with reference to FIG. 13, this is due to the fact that the bits of "1" data among the bits of the soft bit data SB1 are present only at a very low ratio, for example, 1% or less.

FIG. 28 illustrates a case where two bits of "1" data are present among the 64 bits. Specifically, data of an s-th bit (s is a natural number) from the top is "1" data, and data of another t-th bit (t is a natural number) from the bottom is "1" data.

For example, 7 bits among the 16 bits of the compressed data DCC generated by the compression circuit CMPb represent s, and other 7 bits among the 16 bits of the compressed data DCC generated by the compression circuit CMPb represent t. Therefore, for example, the memory controller 2 can generate, based on the compressed data DCC, the data De[7:0] and the data Do[7:0] of the plane PB0, the data De[7:0] and the data Do[7:0] of the plane PB1, the data De[7:0] and the data Do[7:0] of the plane PB2, and the data De[7:0] and the data Do[7:0] of the plane PB3, which are used to generate the compressed data DCC.

The case where two bits of "1" data are present in the data DATA has been described above. Even in a case where the number of bits of "1" data is 1 or less in the data DATA, the compression circuit CMPb can similarly generate compressed data.

In the above description, the example has been described in which the compression circuit CMPb receives the 8-bit compressed data from each of the four planes PB and generates the 16-bit compressed data based on the 32-bit data received in this manner. However, the present embodiment is not limited thereto. For example, the compression circuit CMPb may receive 8-bit compressed data from each of three of the planes PB and generate 16-bit compressed data based on the 24-bit data received in this manner.

Furthermore, the compression circuit CMPb may receive, for example, the 16-bit uncompressed data De[7:0] and Do[7:0] in total from a certain division DIV of the plane PB0 via the interconnect group ICGL-L and the interconnect group ICGU-L, receive the 16-bit uncompressed data De[7:0] and Do[7:0] in total from a certain division DIV of the plane PB2 via the interconnect group ICGL-R and the interconnect group ICGU-R, and generate such 16-bit compressed data as described above based on the 32-bit data received in this manner.

The semiconductor memory device 1b according to the third embodiment described above is obtained by replacing the multiplexer MUX with the multiplexer MUXb in the semiconductor memory device 1 according to the first embodiment. However, the present embodiment is not limited thereto. For example, the technology disclosed in the third embodiment may be implemented by replacing the multiplexer MUX with the multiplexer MUXb in the semiconductor memory device 1a according to the second embodiment.

Therefore, according to the semiconductor memory device 1b according to the third embodiment, the efficiency of moving data from the semiconductor memory device 1b to the memory controller 2 can be improved as in the semiconductor memory device 1 according to the first embodiment. According to the semiconductor memory device 1b according to the third embodiment, the efficiency of moving data can be improved as compared with the semiconductor memory device 1 according to the first embodiment.

Other Embodiments

In the present specification, the term "couple" refers to electrical coupling, and does not exclude, for example, connection via another component.

In the present specification, the notations "same", "match", "constant", and "maintained" are intended to include a case where there is an error within the range of design when the technology described in the embodiment is implemented. The same applies to a case where the term "substantially" is used together with the notation, such as "substantially the same". In addition, the notation of applying or supplying a certain voltage is intended to include both performing control to apply or supply the voltage and actually applying or supplying the voltage. Applying or supplying a certain voltage may include applying or supplying, for example, a voltage of 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
    a core unit including a first memory cell group and a second memory cell group; and
    a control circuit configured to, in response to a read command including designation of a first address and designation of a second address, read first data from the first memory cell group, read second data from the second memory cell group, and output third data and fourth data via different portions of external terminals in parallel, the first address corresponding to the first memory cell group, the second address corresponding to the second memory cell group, the designation of the second address being made after the designation of the first address, the third data corresponding to the read first data, and the fourth data corresponding to the read second data.

2. The semiconductor memory device according to claim 1, wherein
    the core unit includes a first plane and a second plane, the first plane includes the first memory cell group, and the second plane includes the second memory cell group, and
    the first address corresponds to the first plane, and the second address corresponds to the second plane.

3. The semiconductor memory device according to claim 2, wherein each of the first plane and the second plane includes a sense amplifier module and a row decoder module.

4. The semiconductor memory device according to claim 1, wherein the third data is obtained by compressing the first data, and the fourth data is obtained by compressing the second data.

5. The semiconductor memory device according to claim 2, wherein
    each of the first plane and the second plane includes a compression circuit,
    the compression circuit of the first plane compresses the first data to generate the third data, and
    the compression circuit of the second plane compresses the second data to generate the fourth data.

6. The semiconductor memory device according to claim 2, wherein
the first plane includes a first circuit configured to read the first data from the first memory cell group via a first number of first bit lines and generate the third data based on the read first data,
the second plane includes a second circuit configured to read the second data from the second memory cell group via the first number of second bit lines and generate the fourth data based on the read second data,
the number of bits of the first data is the first number,
the number of bits of the second data is the first number,
the number of bits of the third data is equal to or less than half of the first number, and
the number of bits of the fourth data is equal to or less than half of the first number.

7. The semiconductor memory device according to claim 6, wherein
the first plane further includes a first data latch group capable of holding the first data,
the first circuit generates the third data based on the first data held in the first data latch group,
the second plane further includes a second data latch group capable of holding the second data,
the second circuit generates the fourth data based on the second data held in the second data latch group, and
the control circuit further performs control to cause the generated third data to be held in the first data latch group, and performs control to cause the generated fourth data to be held in the second data latch group.

8. The semiconductor memory device according to claim 6, further comprising an output circuit that outputs the third data and the fourth data to the outside of the semiconductor memory device, wherein
the first plane further includes a first data latch group capable of holding the first data,
the first circuit is coupled in series to the first data latch group and coupled in series to the output circuit,
the second plane further includes a second data latch group capable of holding the second data, and
the second circuit is coupled in series to the second data latch group and coupled in series to the output circuit.

9. The semiconductor memory device according to claim 1, wherein each of the first data and the second data is a part of soft bit data.

10. The semiconductor memory device according to claim 1, wherein the external terminals include a first portion for outputting the third data having a bus width of four bits and a second portion for outputting the fourth data having a bus width of four bits.

11. The semiconductor memory device according to claim 2, further comprising an output circuit that outputs the third data and the fourth data to the outside of the semiconductor memory device, wherein
the control circuit further performs control to output the third data and the fourth data to a bus used for transfer of the third data from the first plane to the output circuit and transfer of the fourth data from the second plane to the output circuit.

12. A system comprising:
the semiconductor memory device according to claim 1; and
a controller configured to receive the third data and the fourth data output from the semiconductor memory device, generate the first data based on the third data, and generate the second data based on the fourth data.

13. The system according to claim 12, further comprising signal lines that couple the external terminals and the controller.

14. The system according to claim 13, wherein the external terminals include a first portion for outputting the third data having a bus width of four bits and a second portion for outputting the fourth data having a bus width of four bits.

15. The system according to claim 14, wherein
the controller is further configured to make the designation of the first address, and to make the designation of the second address after the designation of the first address.

16. The semiconductor memory device according to claim 10, wherein
the control circuit is further configured to receive the designation of the first address via the external terminals, and receive the designation of the second address via the external terminals after receipt of the designation of the first address.

* * * * *